United States Patent [19]
Taguchi

[11] Patent Number: 5,963,279
[45] Date of Patent: Oct. 5, 1999

[54] LIQUID CRYSTAL DISPLAY DEVICE CONTAINING OPENINGS IN A PROTECTIVE LAYER TO COMPENSATE FOR DEFECT AND METHOD OF PRODUCING THE SAME

[75] Inventor: Noboru Taguchi, Sayama, Japan

[73] Assignee: Citizen Watch Co., Ltd., Tokyo, Japan

[21] Appl. No.: 08/894,484

[22] PCT Filed: Feb. 23, 1996

[86] PCT No.: PCT/JP96/00428

§ 371 Date: Aug. 22, 1997

§ 102(e) Date: Aug. 22, 1997

[87] PCT Pub. No.: WO96/26463

PCT Pub. Date: Aug. 29, 1996

[30] Foreign Application Priority Data

Feb. 23, 1995 [JP] Japan ................................. 7-034947

[51] Int. Cl.⁶ .................... G02F 1/1333; G02F 1/136; G02F 1/13
[52] U.S. Cl. .................... 349/54; 349/187; 349/49; 349/50; 349/41; 349/122
[58] Field of Search .................... 349/54, 187, 192, 349/49, 50, 41, 138, 122

[56] References Cited

U.S. PATENT DOCUMENTS

| | | | |
|---|---|---|---|
| 5,648,826 | 7/1997 | Song et al. | 349/49 |
| 5,684,547 | 11/1997 | Park et al. | 349/54 |
| 5,808,595 | 9/1998 | Kubota et al. | 349/192 |
| 5,861,928 | 1/1999 | Sekiguchi | 349/49 |
| 5,893,621 | 4/1999 | Sekiguchi | 349/51 |

FOREIGN PATENT DOCUMENTS

| | | |
|---|---|---|
| 1-289916 | 11/1989 | Japan . |
| 2-67523 | 3/1990 | Japan . |
| 2-140726 | 5/1990 | Japan . |
| 4-260374 | 9/1992 | Japan . |
| 7-199223 | 8/1995 | Japan . |

*Primary Examiner*—William L. Sikes
*Assistant Examiner*—Kari M. Horney
*Attorney, Agent, or Firm*—Armstrong, Westerman, Hattori, McLeland & Naughton

[57] ABSTRACT

In a liquid crystal display device using thin-film diodes or thin-film transistors as switching elements, a protection film is provided on the entire surface of a substrate on which switching elements and signal electrodes or scanning electrodes are formed, openings are defined in corresponding positions between each electrode of the protection film and the remaining portion of each electrode layer material inside each opening is removed by an etching treatment. For example, the protection film is provided on the entire surface of the substrate 1 on which two thin-film diodes 11 and 12 are formed with a back-to-back connection relative to each picture-element electrode, and an opening portion 36 having openings 36c, 36d and 36e which are defined in corresponding positions between the picture-element electrodes 6, between the signal electrode 13 and the picture-element electrode 6 and between the signal electrodes 13 is provided, and the remaining portion of an electrode layer material inside the opening portion 36 is removed by etching. Since short-circuits between the electrodes as indicated by 21, 32 and 34 are eliminated, display defects are drastically reduced, display quality is improved and production yield is also improved.

14 Claims, 15 Drawing Sheets

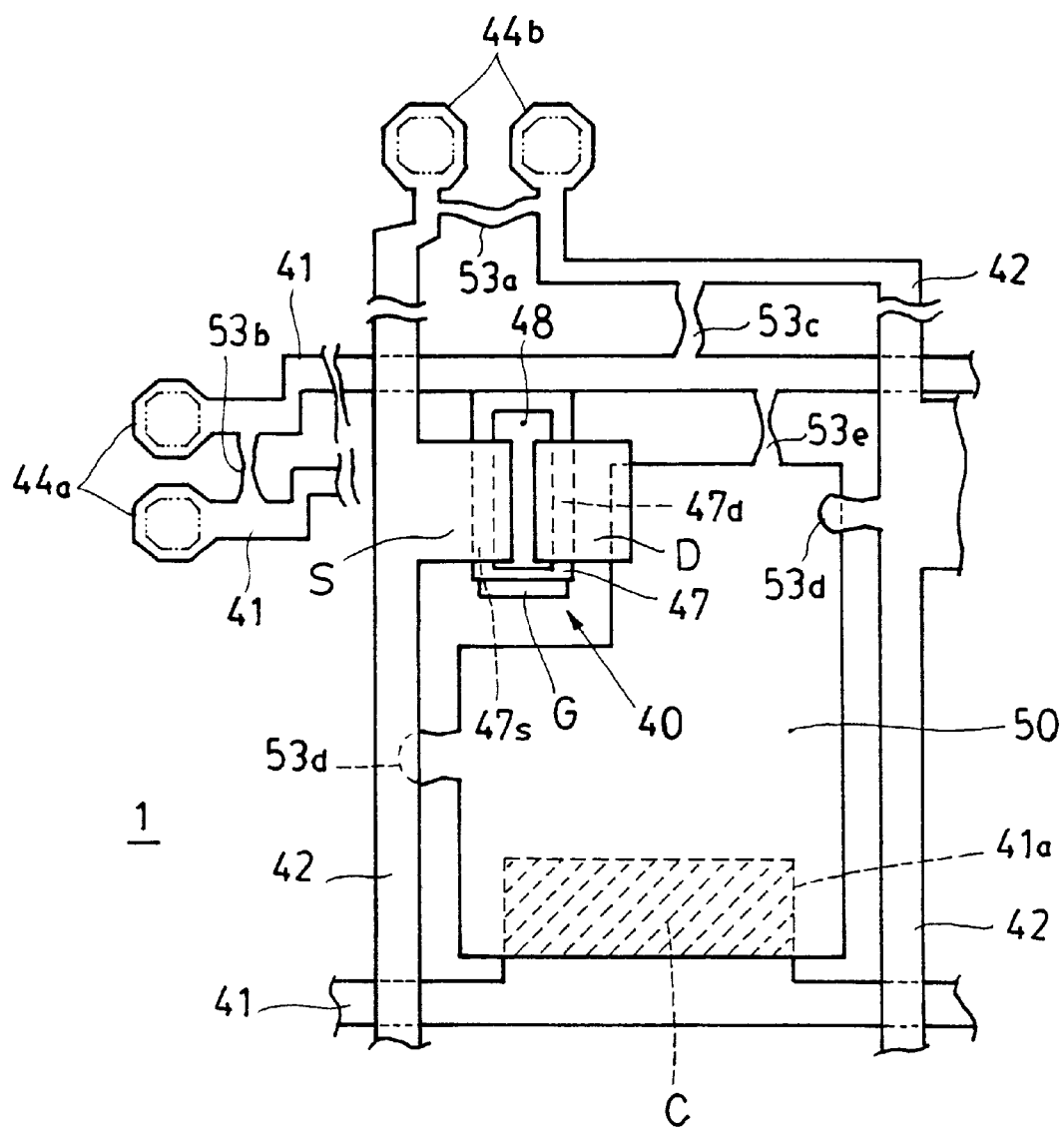

ical Field

LIQUID CRYSTAL DISPLAY DEVICE CONTAINING OPENINGS IN A PROTECTIVE LAYER TO COMPENSATE FOR DEFECT AND METHOD OF PRODUCING THE SAME

TECHNICAL FIELD

The invention relates to a monochrome or colored liquid crystal display device which is widely used for watches, calculators, video cameras, and various other electronic devices and a method of producing the same.

Particularly, the invention relates to a structure of a liquid crystal display device for driving liquid crystal by controlling a thin film diode or a thin film transistor serving as a nonlinear element provided for each picture-element disposed in a matrix shape on a display screen and a method of producing the same.

BACKGROUND TECHNOLOGY

The display capacity of liquid crystal display devices using a liquid crystal panel has been recently increased.

In a simple matrix structured liquid crystal display device employing a multiplex driving system, the contrast drops or the response speed reduces as a time-shared system is further developed. Accordingly, if the liquid crystal display device has about 200 scanning lines, it is difficult to obtain a sufficient contrast.

Accordingly, there has been employed an active matrix system liquid crystal panel having switching elements in each picture-element to remove such drawbacks.

In the active matrix system liquid crystal panel, there are two types: one is a three terminal system employing thin film transistors (hereinafter referred to as "TFT") serving as switching elements and the other is a two terminal system employing thin film diodes (hereinafter referred to as "TFD") serving as nonlinear resistors. The two terminal system is superior to the three terminal system since the former is simple in structure and easier to produce.

A diode type, a varsity type, and an MIM (Metal-Insulator-Metal) type have been developed as the two terminal system.

The structure of a liquid crystal display device employing conventional thin film diodes will be now described with reference to FIG. 20 which is a plan view showing a part thereof and FIG. 21 which is a cross sectional view taken along the line A—A in FIG. 20.

The liquid crystal display device comprises, as shown in FIG. 21, a first substrate 1 and a second substrate 2 respectively made of a transparent material such as glass, wherein the first and second substrates 1 and 2 oppose each other with a certain gap via a spacer 3 and a liquid crystal 4 is filled in between the first and second substrates 1 and 2.

A lower electrode 5 and a picture-element electrode 6 (display electrode) are disposed on the first substrate 1 in a matrix shape as shown in FIG. 20, and an anodic oxidation layer 7 as a nonlinear resistor layer is formed on the lower electrode 5. Further, a pair of upper electrodes 8 and 9 are disposed on the anodic oxidation layer 7 so as to overlap each other.

A thin film diode (TFD) 11 as a first nonlinear resistor element is structured by the lower electrode 5, the anodic oxidation layer 7 and the upper electrode 8, and a TFD 12 as a second nonlinear resistor element is structured by the lower electrode 5, the anodic oxidation layer 7 and the upper electrode 9.

The upper electrode 8 of the first TFD 11 is connected with a signal electrode 13 (FIG. 20) which applies a signal from the outside to the TFD 11, and the upper electrode 9 of the second TFD 12 is connected to the picture-element electrode 6.

A switching element part is structured by the first TFD 11 and the second TFD 12, and an electric path is formed in the order of: "the signal electrode 13→ the upper electrode 8→ the anodic oxidation layer 7→ the lower electrode 5→ the anodic oxidation layer 7→ the upper electrode 9→ the picture-element electrode 6".

On the other hand, a black matrix 14 is provided on the surface of the second substrate 2 opposing the first substrate 1 at an entire region thereof as hatched in FIG. 20 for preventing leaking of light from a gap between each picture-element electrode 6 disposed on the first substrate 1. That is, the black matrix 14 is provided on a non-display part for intercepting light.

Further, an opposing electrode 15 formed as a scanning electrode is disposed on the second substrate 2 while opposing the picture-element electrode 6 as shown in FIG. 21 and it is arranged in a belt shape as shown in FIG. 20 via an insulating film 16 so as not to contact the black matrix 14 and be short circuited.

In FIG. 21, the lower electrode 5, the upper electrodes 8 and 9, the picture-element electrode 6 and the signal electrode 13 respectively on the first substrate 1 are shown by broken lines, and the anodic oxidation layer 7 is omitted in the illustration, and the black- matrix 14 and the opposing electrode 15 under the second substrate 2 are shown by solid lines.

Orientation films 17 and 18 are provided at opposing surfaces of the first and second substrates 1 and 2 as processing layers for regularly arranging molecules of the liquid crystal 4. Deflector plates, not shown, are provided at outside surfaces of the first substrate 1 and the second substrate 2, and they are irradiated by back light by a surface light source, not shown, from the direction of an arrow 19.

The picture-element electrode 6 is arranged to overlap the opposing electrode 15 via the liquid crystal 4, and it becomes the picture-element part of a liquid crystal display panel, wherein the liquid crystal display device performs a given image display owing to the change of the light transmittance caused by the change of the orienting state of the liquid crystal 4 on the region where the black matrix 14 is not formed on the picture-element electrode 6.

FIG. 22 is an equivalent circuit of the liquid crystal display device, wherein the signal electrode 13 and the opposing electrode (scanning electrode) 15 are formed in a matrix shape, and the first TFD 11 and the second TFD 12 are arranged with each other with a back-to-back connection between the signal electrode 13 and the opposing electrode 15, and there is formed a switching circuit which conducts from the picture-element electrode 6 to the opposing electrode 15 via the capacitor of the liquid crystal 4.

When a voltage having a value exceeding a threshold value is selectively applied between the signal electrode 13 and the opposing electrode 15, an ON current flows in the switching circuit between the signal electrode 13 and the opposing electrode 15 so as to turn the orientation of the liquid crystal 4 between the picture-element electrode 6 and the opposing electrode 15, thereby allowing light to pass through the liquid crystal 4.

Whereupon, characteristics of the thin film diode at plus and minus sides can be made symmetric when two TFDs 11 and 12 are used with a back-to-back connection although the thin film diode (TFD) frequently demonstrates asymmetric voltage-current characteristics depending on the polarity of an applied voltage.

However, the switching circuit can be structured with one TFD for every picture-element, and an equivalent circuit of the liquid crystal display device in such a case becomes like the one as illustrated in FIG. 23. Denoted by 10 is a TFD like the first and second TFDs 11 and 12, and it structures a switching circuit between each signal electrode 13 and each opposing electrode (scanning electrode) 15 wherein the TFD 10 is in series with the capacitor of the liquid crystal 4 between the picture-element electrode 6 and the opposing electrode 15.

A method of fabricating a thin film diode (TFD) by a conventional treatment when producing the liquid crystal display device shown in FIGS. 20 to 22 is explained with reference to a plan view in FIG. 24 and cross sectional views in FIGS. 25 to 29 respectively showing each fabricating step.

First of all, a lower electrode layer material 21 made of tantalum is formed on the entire surface of the first substrate 1 (hereinafter referred to merely as "substrate") made of glass by a sputtering treatment shown in FIG. 25.

Thereafter, a photoresist is formed on the entire surface of the lower electrode layer material 21 by a spin coating method, then an exposing and developing treatment is performed using a given photo mask, thereby forming a first photoresist 22 which was subject to a patterning treatment in the shapes of lower electrode layers 21a and 21b as shown in FIG. 26.

In the aforementioned processing steps, there is a likelihood that dust particle 31 may be formed on the lower electrode layer material 21 owing to the sticking of dust immediately after the formation of the lower electrode layer material 21 made of tantalum, or the sticking of dust on the first photoresist 22 or contamination of the photo mask.

Thereafter, the lower electrode layer material 21 is subject to a patterning treatment using the first photoresist 22 as an etching mask by a dry etching technique, thereby forming the lower electrode layers 21a and 21b as shown in FIG. 26.

In the etching treatment for forming the lower electrode layers 21a and 21b, the dust particle 31 becomes an etching mask, thereby forming the lower electrode layer 21a having a pattern shape which is larger than the prescribed dimensions. The lower electrode layer 21b having a pattern shape which is larger than the prescribed dimensions is formed depending on the sticking position of the dust particle 31.

The plane pattern shapes of the lower electrode layer 21a forming the lower electrode 5 of the thin film diode (TFD), the lower electrode layer 21b forming the lower layer of the signal electrode 13 and a lower electrode layer 21c formed in surplus are respectively shown by solid and broken lines in FIG. 24, and the region where they finally remain is hatched.

Thereafter, as shown in FIG. 26, the lower electrode layers 21a to 21c are subject to an anodic oxidation treatment at the surfaces thereof, and the anodic oxidation layers 7 serving as the nonlinear resistor layer are formed on each surface of the lower electrode layers 21a to 21c with a film thickness of 35 nm.

Further, as shown in FIG. 27, a transparent electrode film 24, e.g., made of indium tin oxide (ITO), as a transparent conductive film is formed on the entire surfaces of the anodic oxidation layers 7 with the film thickness ranging from 100 to 200 nm by a sputtering treatment.

Then, a photoresist is formed on the entire surface of the transparent electrode film 24 by the spin coating method, and an exposing and developing treatment is performed using a given photo mask, thereby forming a second photoresist 25 having upper layer patterns of the two upper electrodes of the thin film diodes, the picture-element electrode and the signal electrode.

Thereafter, the transparent electrode film 24 is subject to etching using the second photoresist 25 as an etching mask, thereby forming the upper layer patterns of the upper electrodes 8 and 9 of the first and second TFDs, the picture-element electrode 6 and the signal electrode 13 as shown in FIG. 28.

In FIG. 24, the plane pattern shapes of the picture-element electrodes 6 are shown by a one-dotted and chain line and the plane pattern shape of the signal electrode 13 is shown by a two-dotted and chain line. The picture-element electrodes 6 and signal electrode 13 are also formed on the lower electrode layers 21b and 21c.

A driving IC (semiconductor device) connection part 29 for each line is formed on the tip end of each signal electrode 13.

A protection film 26 made of tantalum pentoxide is formed on the entire surface in a thickness ranging from 100 to 200 nm by a sputtering treatment as shown in FIG. 28.

Thereafter, a photoresist is formed on the entire surface of the protection film 26, and an exposing and developing treatment is performed using a given photo mask, thereby forming a third photoresist 27 having an opening pattern 27a.

The opening pattern 27a of the third, photoresist 27 is formed at positions corresponding to a connection part (common electric part) 21d between the lower electrode layers 21a and 21b, and to the driving IC connection part 29 in FIG. 24, whereby the opening portions 26a and 26b are defined in the protection film 26 as shown by a two-dotted and chain line and dots or points.

That is, the connection part 21d of the lower electrode layers and the protection film 26 on the driving IC connection part 29 are subject to etching by a dry etching technique using the third photoresist 27 as an etching mask, thereby forming the protection film 26 having the opening portions 26a and 26b (the opening portion 26b is shown in FIG. 24 alone).

The anodic oxidation layer 7 and the connection part 21d of the lower electrode layer made of tantalum are sequentially subject to etching through the opening 26a.

As a result, the lower electrode layer 21a is separated from the lower electrode layer 21b of the signal electrode 13 as shown in FIG. 24, thereby forming the island-shaped lower electrodes 5 for the first TFD 11 and the second TFD 12.

The protection film 26 is formed for preventing short circuits from occurring between the signal electrode 13 and the picture-element electrode 6 respectively formed on the first substrate 1 on which the TFDs 11 and 12 are provided and the opposing electrodes (scanning electrodes) on the second substrate 2 opposing the signal electrode 13 and the picture-element electrode 6. In FIG. 24, the protection film 26 is not illustrated for convenience of illustration thereof, but only the opening portions 26a and 26b are illustrated.

However, according to such fabricating steps, an anomalous thin film diode part 30 is formed by the lower electrode layer 21c protruded from the lower electrode layer 21b of the signal electrode 13 by the dust particle 31 other than the first TFD 11 connected with the signal electrode 13 and the second TFD 12 connected with the picture-element electrode 6 as shown in the plan view in FIG. 24 and the cross-sectional view in FIG. 29.

When the anomalous thin film diode part 30 is formed in such a manner, the ratio of capacitance between the TFDs 11 and 12 and the liquid crystal is changed, thereby changing a threshold value of the liquid crystal driving voltage. Accordingly, even if a given voltage is applied between the signal electrodes 13 and the opposing electrodes 15 as shown in FIG. 22, an ON-current does not flow, thereby forming picture-elements in which the oriented states of the liquid crystal 4 are not changed, leading to the occurrence of the problem that the liquid crystal display device has a line defect.

Further, as shown in FIG. 24, there is a likelihood of occurrence of defects such as a short circuit 32 between the picture-element electrodes where the picture-element electrodes 6 are short-circuited, a short circuit 33 between the signal electrode and the picture-element electrode where the signal electrode 13 and the picture-element electrode 6 are short-circuited, or a short circuit 34 between signal electrodes where the signal electrodes 13 are short-circuited.

The defects of these short circuits occur owing to the remenant of etching of the lower electrode layer material 21 made of tantalum or transparent electrode film 24, and there is a problem that the liquid crystal display device will have a line defect owing to such occurrence of short circuits, thereby deteriorating the display quality.

The problem in the liquid crystal display device using such a thin film diode (TFD) as switching elements will occur likewise in a liquid crystal display device using thin film transistors (TFT) as switching elements.

This problem will be now described with reference to FIG. 30. FIG. 30 is a plan view showing a part of an active matrix substrate constituting a liquid crystal display device using conventional thin film transistors.

The active matrix substrate of this liquid crystal display device corresponds to the first substrate of the conventional liquid crystal display device, and comprises a substrate 1 made of transparent glass, and a gate electrode G made of the same material and a scanning electrode 41 respectively provided on the substrate 1.

An anodic oxidation layer is formed on the surfaces of the gate electrode G and scanning electrode 41, and an insulating coating film is provided on the anodic oxidation layer, thereby constituting a gate insulating film together with the anodic oxidation layer, which is however not illustrated.

A source region 47s, a drain region 47d and a semiconductor layer 47 forming a central channel region are respectively provided on the gate insulating film, and a channel stop layer 48 is provided on the semiconductor layer 47. A picture-element electrode 50 comprising a transparent electrode film is provided.

A source electrode S which is continuous with a signal electrode 42 via an ohmic contact layer (not shown) and a drain electrode D which is connected with the picture-element electrode 50 are respectively provided on the channel stop layer 48, thereby structuring a thin film transistor 40.

Further, an accumulation capacitor C having a [metal-insulating film-metal] structure is structured by a region opposing the thin film transistor 40 of the picture-element electrode 50, a large width part 41a formed in the scanning electrode 41 as shown by broken lines in the same figure, and a gate insulating film, not shown, provided between the region opposing the thin film transistor 40 and the large width part 41a.

Driving IC connection parts 44a and 44b for mounting driving ICs for driving the liquid crystal display device are respectively provided at end parts of the scanning electrodes 41 and the signal electrodes 42.

Even in such an arrangement, there is a likelihood of occurrence of defects of short circuits 53a to 53e between electrodes, namely, between the picture-element electrode 50 in the picture-elements and the signal electrode 42, between the picture-element electrode 50 and the scanning electrode 41, between the signal electrodes 42 serving as a signal path to the driving ICs for driving the liquid crystal display device, between the scanning electrodes 41 and between the scanning electrode 41 and the signal electrode 42, which are respectively caused by dust particle generated in the exposing and developing step of the photoresist like the case where the thin film diode is fabricated on the substrate.

In the liquid crystal display device where one picture-element area is miniaturized, the dimensions of gaps between respective electrodes become small, and hence such defects of short circuits frequently occur.

The defects of short circuits such as the short circuit between the picture-elements and that between the electrodes in the liquid crystal display device using such thin film diodes or thin film transistors as switching elements are caused by the sticking of dust during the process of patterning of a photoresist, etc. Most of the dust is generated with the manufacturing apparatus or human beings acting as the dust generation sources, and it is very difficult to eliminate such generation of dust. With the defects of such short circuits, a display defect frequently occurs in the liquid crystal display device, leading to the deterioration of the display quality. This also causes poor yield when producing the liquid crystal display device.

Whereupon, active matrix type liquid crystal display devices have recently required a large screen with high quality, and they have been widely applied to a viewfinder or a view terminal employing a liquid crystal panel, a projection TV, or a navigation TV, and hence they further required high yield with a high precision pattern.

The present invention solves the aforementioned problems, and it is an object of the invention to provide a liquid crystal display device using thin film diodes or thin film transistors as switching elements capable of improving display quality thereof and capable of producing a liquid crystal display device having a high display quality with high yield.

DISCLOSURE OF THE INVENTION

The invention is structured as follows to achieve the above objects in a liquid crystal display device, and comprises a first transparent substrate and a second transparent substrate opposing each other with a certain gap, a liquid crystal filled between the first and second substrates, signal electrodes and picture-element electrodes forming each of a plurality of display picture-elements respectively disposed on the first substrate, thin film diodes provided between the signal electrodes and each picture-element electrode as switching elements for controlling a flow of current to each picture-element electrode, an opposing electrode provided on the second substrate via each picture-element electrode on the first substrate and the liquid crystal.

That is, a protection film of tantalum pentoxide or the like is formed on an entire surface of the first substrate so as to cover the signal electrodes, each picture-element electrode and each thin film diode, an opening portion is provided to have openings in corresponding positions between the picture-element electrodes of the protection film, between the signal electrode and the picture-element electrode, and between the signal electrodes, and a remaining portion of electrode layer material forming the signal electrode and picture-element electrode inside the opening portions are removed by etching.

With such a structure, even if there occur defects such as a short circuit between the picture-elements, or a short circuit between the electrodes, a display defect seldom occurs because the remaining portion of the film which causes such short circuit defects is eventually removed, thereby leading to an improvement in the display quality as well as an improvement in yield when producing the liquid crystal display device. Two thin film diodes are provided between the signal electrode and each picture-element electrode with a back-to-back connection, a lower electrode common to the two thin film diodes and a lower electrode layer of the signal electrodes are connected with each other by a connection part for anodic oxidation treatment, the opening portion of the protection film has an opening in a position corresponding to the connection part, and the connection part inside the opening as well as the remaining portion is removed by etching.

The method of producing a liquid crystal display device by employing such a thin film diode according to the present invention includes the following steps.

(1) A first step for forming a lower electrode layer material on the entire surface of the first substrate, comprising subjecting a first photoresist to a patterning treatment on the lower electrode layer material, performing an etching treatment using the first photoresist as an etching mask so as to form a lower electrode layer of the thin diodes, and then removing the first photoresist.

(2) A second step for forming an anodic oxidation layer on the surface of the lower electrode layer by an anodic oxidation treatment, the anodic oxidation layer serving as a non-linear resistor layer of the thin film diode.

(3) A third step for forming a transparent electrode film on an entire surface of the first substrate on which the lower electrode layer and the anodic oxidation layer on the lower electrode layer are formed, comprising subjecting a second photoresist to a patterning treatment on the transparent electrode film, performing an etching treatment using the second photoresist as an etching mask to form an upper electrode, the signal electrodes and picture-element electrodes on the thin film diode, and then removing the second photoresist.

(4) A fourth step for forming the protection film on the entire surface of the first substrate which was subject to the first and second steps, comprising subjecting a third photoresist to a patterning treatment on the protection film, performing an etching treatment using the third photoresist as an etching mask to define openings in corresponding positions between the picture-element electrodes of the protection film, between the signal electrode and the picture-element electrode, and between the signal electrodes, and removing remaining portions of the lower electrodes and the transparent electrode film inside each opening.

According to this method, a liquid crystal display device with high display quality can be produced with high yield by employing a thin film diode as a switching element.

In the fourth step, an overetching treatment is performed when performing an etching treatment for defining the opening on the protection film, thereby removing the remaining portion of the lower electrode layer inside each opening which is thus defined, then an etching treatment for the transparent electrode film material is performed while the third photoresist remains attached, thereby removing the remaining portion of the transparent electrode film inside each opening of the protection film, after which the third photoresist can be removed.

Alternatively, after the remaining portion of the lower electrode layer inside each opening of the protection film is removed by the overetching treatment, the third photoresist is removed, and then the etching treatment is performed using the protection film as an etching mask, thereby removing the remaining portion of the transparent electrode film inside each opening of the protection film. In the third step, a driving IC connection part for driving the liquid crystal display device can be continuously formed with the formation of the signal electrode when the upper electrode of the thin film diodes, the signal electrode and the picture-element electrode are formed by etching the transparent film.

In the fourth step, in such a case, after the protection film was formed, an etching treatment is performed using the third photoresist as an etching mask to define openings in corresponding positions between the picture-element electrodes of the protection film, between the signal electrode and the picture-element electrode, between the signal electrodes and a position corresponding to the driving IC connection part, and by performing an overetching treatment to remove the remaining portion of the lower electrode layer inside each opening.

Thereafter, a resin film is formed so as to cover the opening in a position corresponding to the driving IC connection part of the protection film.

An etching treatment is performed using the third photoresist and the resin film as an etching mask to remove the remaining portion of the transparent electrode film inside each opening which is not covered with the resin film, and thereafter the third photoresist and the resin film are removed.

Alternatively, after the remaining portion of the lower electrode layer inside each opening of the protection film is removed by the overetching treatment, the third photoresist is removed for forming the resin film so as to cover the opening in a position corresponding to the driving IC connection part of the protection film, and then the etching treatment is performed using the protection film and the resin film as an etching mask, thereby removing the remaining portion of the transparent electrode film inside each opening of the protection film which is not covered with the resin film.

To achieve the above object, the present invention is further structured as the following in a liquid crystal display device, and comprises a first transparent substrate and a second transparent substrate opposing each other with a certain gap, a liquid crystal filled between the first and second substrates, scanning electrodes, signal electrodes and picture-element electrodes forming each of a plurality of display picture-elements respectively disposed on the first substrate, thin film transistors being provided between the scanning electrodes, the signal electrodes and each picture-element electrode as switching elements for controlling a flow of current to each picture-element electrode.

That is, a protection film is formed on an entire surface of the first substrate so as to cover the scanning electrodes, signal electrodes, each picture-element electrode and each thin film transistor, an opening portion is provided to have each opening in a position corresponding to at least between the signal electrode and the picture-element electrode, between the scanning electrodes, and between the signal electrodes, and the remaining portion of the electrode layer material forming the scanning electrodes, signal electrodes or picture-element electrodes inside each opening is removed by etching.

The method of producing a liquid crystal display device employing a thin film transistor as such a switching element according to the present invention includes the following steps.

(1) A first step for forming an electrode film made of respective electrode materials on the first substrate for the scanning electrodes, the signal electrodes, each picture-element electrode, a gate electrode, a source electrode, and a drain electrode forming each thin film transistor, comprising subjecting a photoresist to a patterning treatment on the electrode film, and repetitively performing an etching treatment using the patterned photoresist as an etching mask.

(2) A second step for forming a protection film on the entire surface of the substrate on which each electrode and the thin film transistor are formed, comprising subjecting the photoresist to a patterning treatment on the protection film, etching the protection film using the patterned photoresist as an etching mask, defining each opening in positions corresponding to at least between the signal electrode and the picture-element electrode, and between the scanning electrodes, between the signal electrodes, and thereafter removing the remaining portion of the electrode film inside each opening.

Further in the above first step, it is possible to form a connection part which is continuous with the scanning electrodes and another connection part which is continuous with the signal electrodes respectively serving as a driving IC connection part for driving the liquid crystal display device.

In such a case, in the second step, when the protection film is formed by etching the protection film to define each opening in a position corresponding to at least between the signal electrode and the signal picture-element electrode, and between the scanning electrodes, between the electrodes, an opening is also defined in a position corresponding to the driving IC connection part.

A resin film is formed to cover the opening in a position corresponding to the driving IC connection part of the protection film, and an etching treatment is performed using the photoresist and the resin film or the protection film and the resin film as an etching mask, for removing the remaining portion of the electrode film in each opening which is not covered with the resin film, and then removing the resin film or the photoresist and the resin film.

The invention further provides a method of producing the liquid crystal display device using the thin film transistors having the following steps.

(1) A first step for forming a gate electrode material serving as the scanning electrodes on an entire surface of the first substrate, comprising subjecting a first photoresist to a patterning treatment on the gate electrode material, etching the gate electrode material using the first photoresist as an etching mask, forming a first IC driving connection part for driving a gate electrode of a thin film transistor, the scanning electrodes and the liquid crystal display device, and then removing the first photoresist.

(2) A second step for forming a gate insulating film on an entire surface of the substrate which was subject to the first step, comprising subjecting a second photoresist to a pat-terning treatment on the gate insulating film, performing an etching treatment using the second photoresist as an etching mask to remove the gate insulating film on the first driving IC connection part, and then removing the second photoresist.

(3) A third step of subsequently forming a semiconductor layer and a channel stopper layer on the gate insulating film, comprising subjecting a third photoresist to a patterning treatment on the channel stopper layer, performing an etching treatment using the third photoresist as an etching mask, subjecting the channel stopper layer to a patterning treatment on the semiconductor layer, and then removing the third photoresist.

(4) A fourth step for subjecting a fourth photoresist to a patterning treatment on the semiconductor layer and the channel stopper layer, comprising etching the semiconductor layer using the fourth photoresist as an etching mask to form a semiconductor layer having a predetermined shape opposing the gate electrode, and then removing the fourth photoresist.

(5) A fifth step for forming a film serving as a material making an ohmic contact layer on an entire surface of the substrate which was subject to the fourth step, comprising subjecting a fifth photoresist to a patterning treatment on the film, etching the film using the fifth photoresist as an etching mask to form the ohmic contact layer, and then removing the fifth photoresist.

(6) A sixth step for forming a transparent electrode film on an entire surface of the substrate which was subject to the fifth step, comprising subjecting a sixth photoresist to a patterning treatment on the transparent electrode film, etching the transparent electrode film using the sixth photoresist as an etching mask to form the picture-element electrodes, and then removing the sixth photoresist.

(7) A seventh step for forming the source electrode and the drain electrode of the thin film transistor, and a film serving as a material for the signal electrodes on the entire surface of the substrate which was subject to the sixth step, comprising subjecting a seventh photoresist to a patterning treatment on the film, performing an etching treatment using the seventh photoresist as an etching mask to form the source electrode, the drain electrode, the signal electrodes and a second driving IC connection part, and then removing the seventh photoresist.

(8) An eighth step for forming a protection film on the entire surface of the substrate which was subject to the seventh step, comprising subjecting an eighth photoresist to a patterning treatment on the protection film, etching the protection film using the eighth photoresist as an etching mask to define openings in a position corresponding to at least one portion between the scanning electrode and the picture-element electrode, between the signal electrode and the picture-element electrode, between the scanning electrodes, between the signal electrodes, between the scanning electrode and the signal electrode, and openings in a position corresponding to the first and second driving IC connection parts.

(9) A ninth step comprising forming, a resin film to cover the openings defined in the positions corresponding to the first and second driving IC connection parts of the protection film.

(10) A tenth step comprising removing the remaining portion of the electrode film inside each opening which is not covered with the resin film using the resin film, and the eighth photoresist or the protection film as an etching mask.

BRIEF DESCRIPTION OF THE DRAWINGS

FIG. 30 is a partial plan view of an active matrix substrate of the liquid crystal display device using the conventional thin film transistors.

BEST MODE FOR CARRYING OUT THE INVENTION

A liquid crystal display device and a method of producing the same will now be described with reference to the attached drawings for explaining the content of the invention more in detail.

Embodiment of a Liquid Crystal Display Device Using a TFD

First, there is described an embodiment of the present invention which is applied to a liquid crystal display device using thin film diodes (TFD) as switching elements and a method of producing the same like the prior art set forth above.

Figure 1:
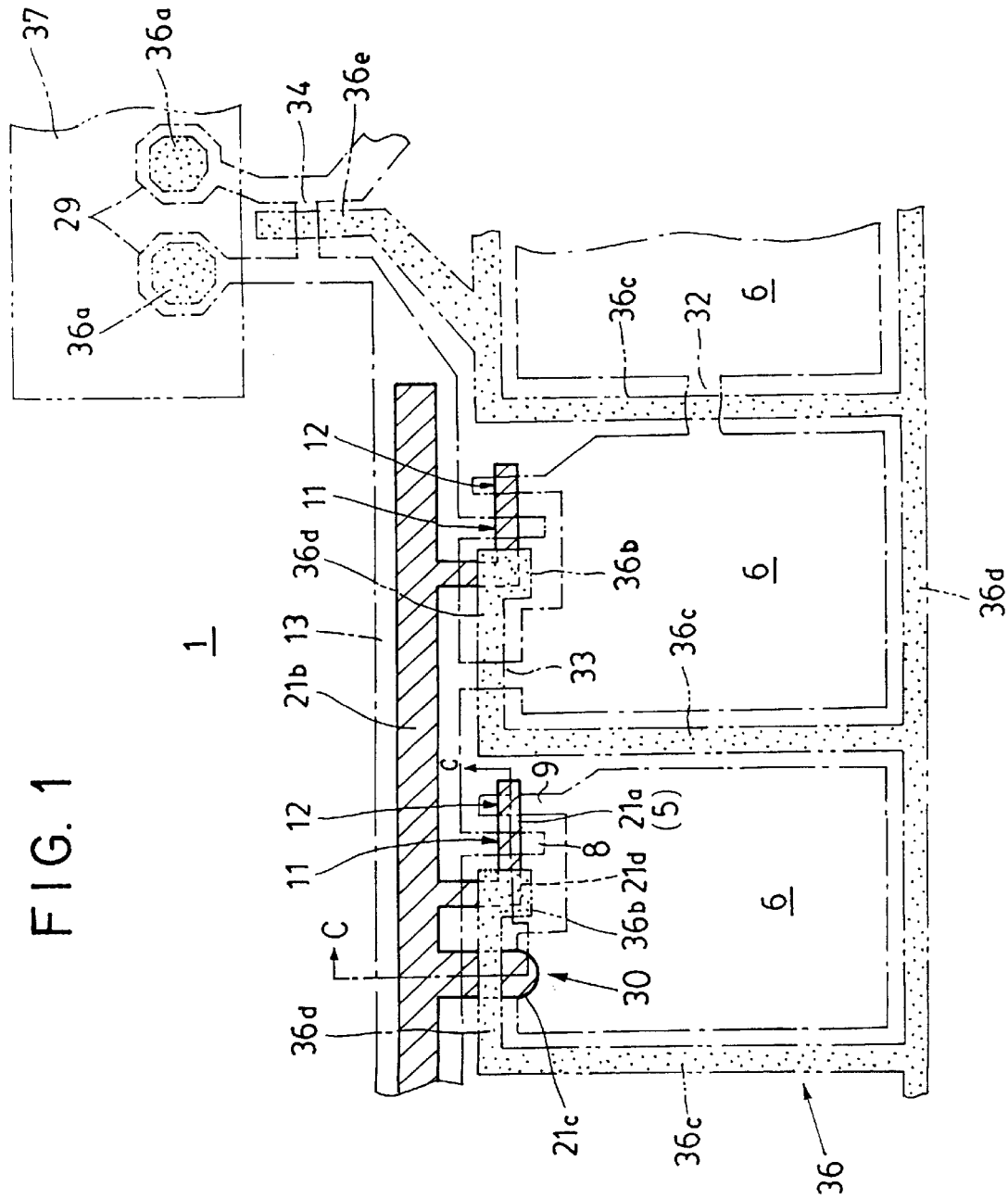
FIG. 1 is a partial plan view showing an embodiment of a liquid crystal display device using thin film diodes of the present invention.

FIG. 1 is a partial plan view showing the liquid crystal display device like in FIG. 24, and FIGS. 2 to 6 are cross-sectional views taken along the line C—C in FIG. 1 for explaining steps of producing the liquid crystal display device.

In these figures, components corresponding to those in FIGS. 20 to 29 which are used for explaining the prior art are denoted by the same numerals.

Figure 6:
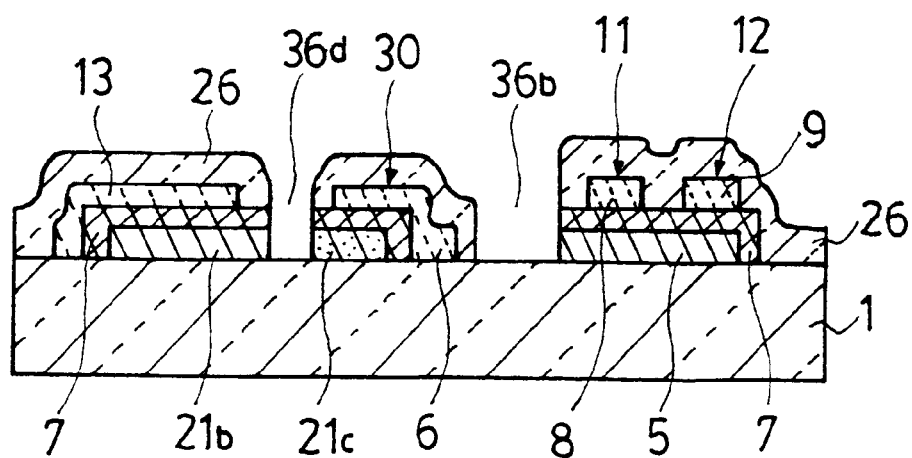
Figure 22:
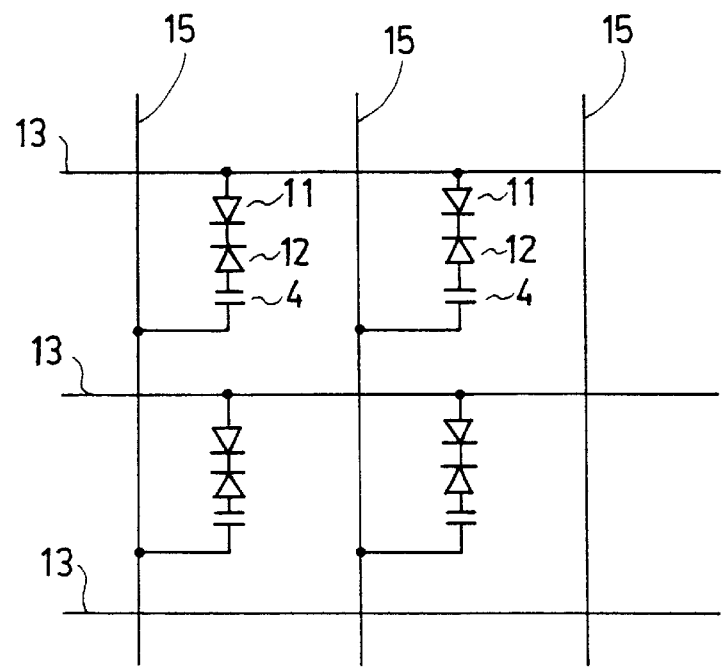
FIG. 22 is an equivalent circuit of the liquid crystal display device shown in FIGS. 20 and 21.

A structure of the liquid crystal display device according to the invention will be now explained with reference to circuit diagrams as shown in FIG. 1, FIG. 6 and FIG. 22 of the prior art.

The liquid crystal display device according to this embodiment, as shown in FIGS. 1 and 6, comprises a substrate 1 made of transparent glass (corresponding to the first substrate in FIG. 21) and a lower electrode layer made of tantalum which is provided on the first substrate 1 and forms a lower electrode layer 21b of a signal electrode and a lower electrode 5 of a thin film diode. Further, an anodic oxidation layer 7 as a nonlinear resistor layer is provided on the surfaces of the lower electrode layer 21b and lower electrode 5.

Still further, a picture-element electrode 6 and a signal electrode 13 respectively formed of transparent electrode film made of indium tin oxide, and upper electrodes 8 and 9 of the thin film diode elements are respectively formed on the anodic oxidation layer 7.

The above-mentioned components structure a first thin film diode (TFD) 11 connected with the signal electrode 13, and a second thin film diode (TFD) 12 connected with the picture-element electrode 6. These structures are the same as those of the conventional liquid crystal display device as explained with reference to FIGS. 24 and 29.

Although this embodiment is the same as the prior art in that the entire surface of the first substrate 1 on which the components set forth above are formed is covered with a protection film 26, the protection film 26 of this embodiment, as shown in an imaginary line and points, has a slit-shaped opening portion 36 comprising openings 36a corresponding to a driving IC (semiconductor device) connection part 29, openings 36b corresponding to a connection part (common electric part) 21d between the lower electrode layers 21a and 21b, openings 36c corresponding to a portion between the adjoining picture-element electrodes 6 and 6, openings 36d corresponding to a portion between the picture-element electrode 6 and the signal electrode 13, and openings 36e corresponding to a portion between the adjoining signal electrodes 13 and 13.

In this case, each of the openings 36b to 36e except the openings 36a corresponding to the driving IC connection part 29 may be formed of the continuous slit-shaped opening portion 36 as shown in FIG. 1, or respective openings may be formed of independent portions. It is desirable that the openings 36c, 36d and 36e between electrodes be formed in a slit shape along a substantially entire length between the adjoining electrodes.

The openings 36a of the opening portion 36 corresponding to the driving IC connection part 29 are provided by opening the protection film 26 alone for exposing the transparent electrode film of the driving IC connection part 29 which is formed integrally with the signal electrode 13, and they are not further etched beyond this exposing purpose.

However, as for the other openings 36b to 36e, all the layers formed on the first substrate 1, namely, the signal electrode 13, the transparent electrode film forming the picture-element electrode 6, the lower electrode layer 21a forming the lower electrode 5 of the first and second TFDs 11 and 12, the lower electrode layer forming the lower electrode layer 21b of the signal electrode 13, etc., and the anodic oxidation layer 7 formed on the lower electrode layer, are removed by etching.

As a result, the lower electrode layer 21a is separated from the lower electrode layer 21b of the signal electrode 13 when the connection part 21d is etched, so that the lower electrode layer 21a becomes an island-shaped lower electrode 5 for the first and second TFDs 11 and 12, and the anomalous thin film diode part 30 is separated from the signal electrode 13 as shown in FIGS. 1 and 6, so that even if there occurs short circuit 32 between the picture-elements, short circuit 33 between the signal electrode and the picture-element or short circuit 34 between signal electrodes, etc., as shown by one dotted and chain line in FIG. 1, such short circuits are shut off, and hence the short circuited state is eliminated.

Accordingly, this liquid crystal display device eliminates the cause of occurrence of the display line defect, thereby improving the display quality.

Figure 21:
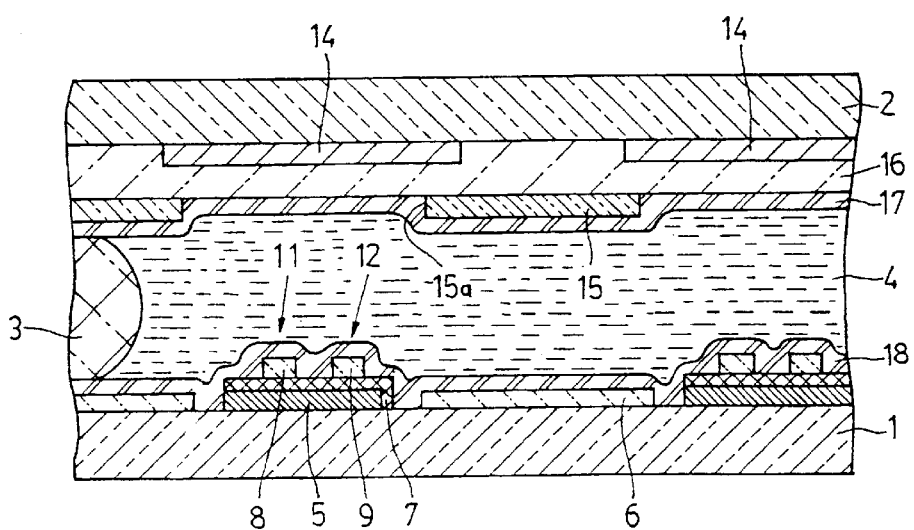
FIG. 21 is a cross sectional view taken along the line A—A in FIG. 20.

Although these figures do not illustrate the orientation film 18 shown in FIG. 21 as the prior art, the orientation film is provided on the entire inner surface of the first substrate 1 and the second substrate 2 when the liquid crystal display device is completed by filling a liquid crystal between the first substrate 1 and the second substrate 2 opposing the first substrate 1 like the liquid crystal display device shown in FIG. 21.

Further, even in this liquid crystal display device, the first TFD 11 and the second TFD 12 are provided with back-to-back connection (serial connection in the opposite direction) like the equivalent circuit shown in FIG. 22.

The value of current flowing from the signal electrode 13 to the picture-element electrode 6 and that from the picture-element electrode 6 to the signal electrode 13 become equal to each other since they become the sum of the forward direction current value and the reverse direction current value of the two thin film diodes 11 and 12, thereby obtaining thin film diode elements having symmetric current-voltage characteristics.

Consequently, it is not necessary to provide an offset circuit in the driving circuit of the liquid crystal display device, thereby leading to an advantage that the direct voltage causing a fixed pattern after image phenomenon of the liquid crystal need not be applied, and further the driving circuit can be produced at a low cost.

Method of Producing a Liquid Crystal Display Device Using TFD

Next, a method of producing a liquid crystal display device, particularly a method of fabricating thin film diode elements will be described.

Figure 2:
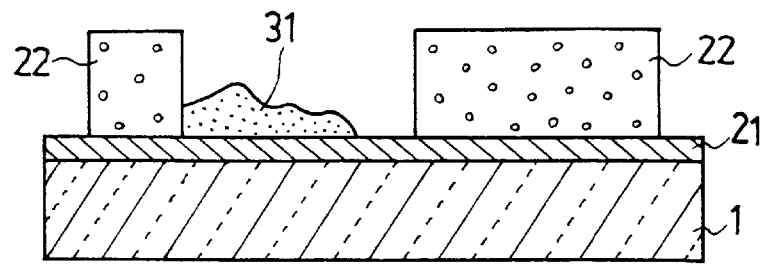
FIGS. 2 to 6 are cross sectional views taken along the line C—C in FIG. 1 for explaining steps of producing the liquid crystal display device in FIG. 1.
Figure 3:
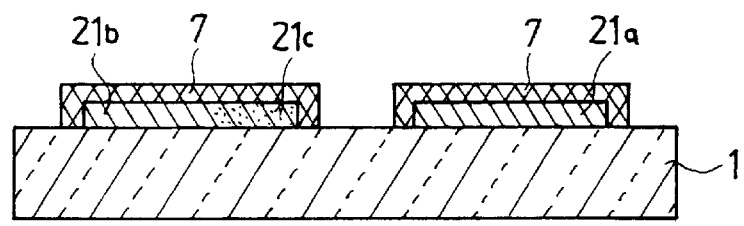
Figure 4:
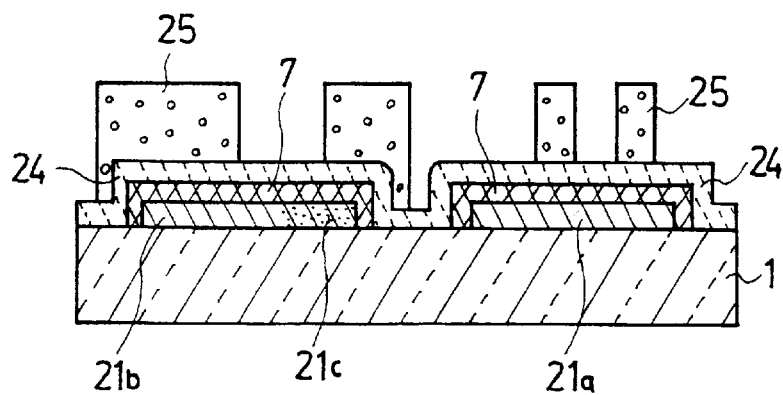
Figure 25:
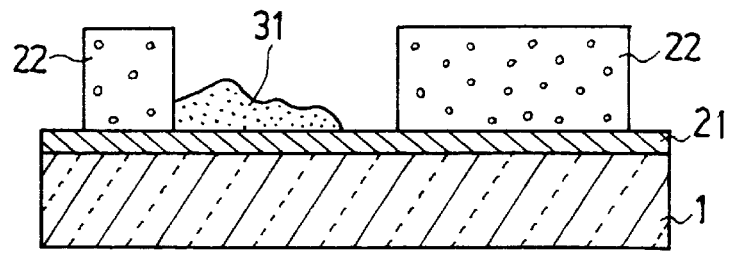
FIGS. 25 to 29 are cross sectional views taken along the line B—B in FIG. 24 for explaining each step of producing the liquid crystal display device.
Figure 26:
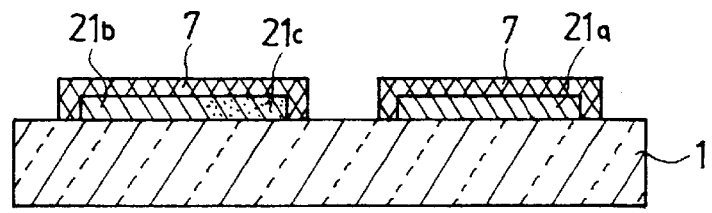
Figure 27:
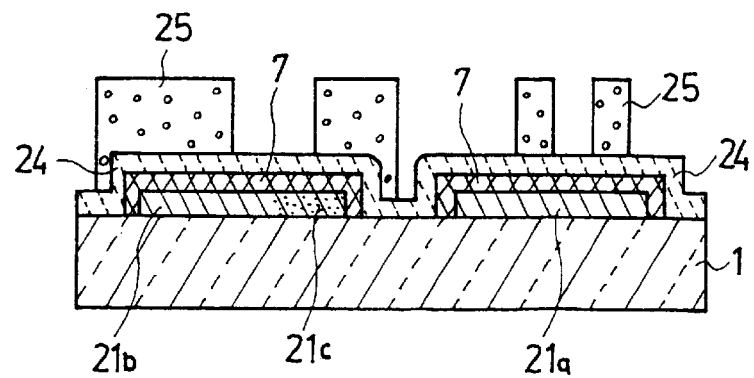
Figure 28:
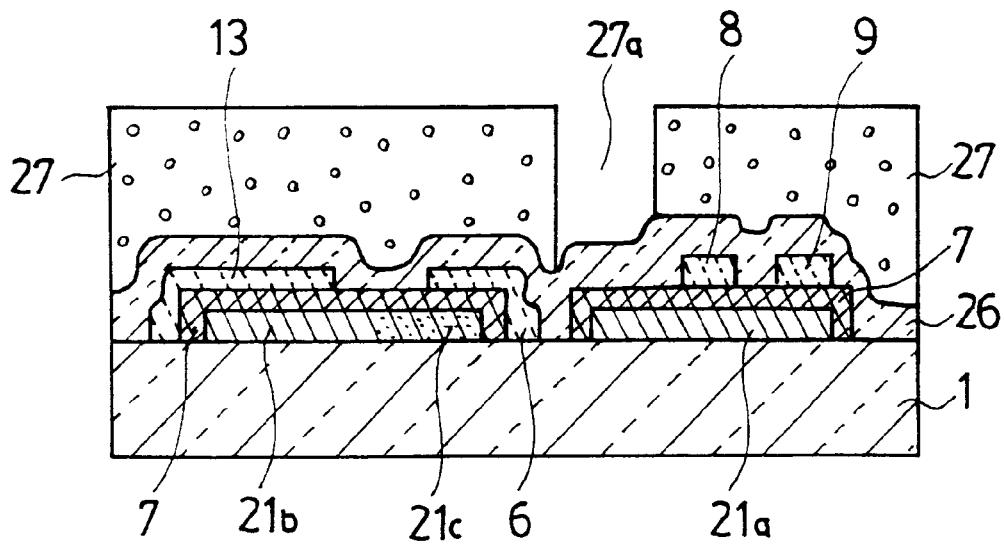
Figure 29:
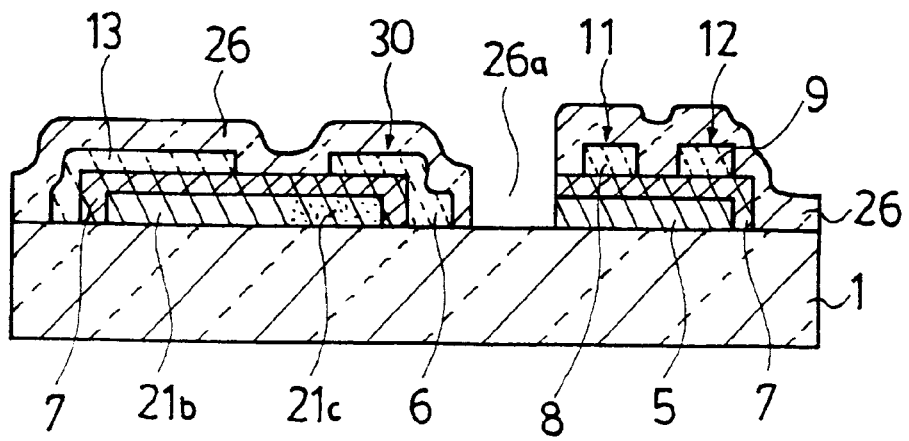

FIGS. 2 to 6 show steps of fabricating the thin film diode element, wherein FIGS. 2 to FIG. 4 are the same as FIGS. 25 to 27 which have been explained in the prior art method as set forth above.

First, as shown in FIG. 2, tantalum which is the lower electrode layer material 21 is formed on the first substrate 1 made of transparent glass in a thickness of 100 nm by a sputtering treatment.

Thereafter, a positive photoresist is formed on the entire surface of the lower electrode layer material 21 by a spin coating method, and then the photoresist is subject to a patterning treatment by an exposing and developing treatment using a first photo mask, thereby forming first photo-resists 22.

In the aforementioned processing steps, there is a likelihood that dust particle 31 is formed on the lower electrode layer material 21, which is caused by the sticking of dust on to the lower electrode layer material 21 immediately after or after the formation of the lower electrode layer material 21 made of tantalum, or by the sticking of dust on to the first photoresist 22 or by contamination of the photo mask.

Then, as shown in FIG. 3, sulfur hexafluoride, helium and oxygen are introduced into an etching chamber of an etching device having a parallel plane type electrode structure as an etching gas respectively at a flow rate of 200 cc/min, 20 cc/min and 30 cc/min, while the pressure in the etching chamber is kept at 50 mTorr with an RF power of 1 kW applied thereto, and then the tantalum film which is the lower electrode layer material 21 is etched using the first photoresist 22 as an etching mask, thereby forming the lower electrode of the thin film diode and the lower electrode layers 21a and 21b forming the lower layer of the signal electrode 13 as shown in FIG. 3.

In the etching treatment for forming the lower electrode layers 21a and 21b, the dust particle 31 becomes an etching mask, and hence the lower electrode layer 21b for the signal electrode having a pattern shape larger than the prescribed dimensions is formed in this example. The portion formed in surplus becomes the lower electrode layer 21c in the drawings in FIG. 3 and succeeding figures. The lower electrode layer 21a for the TFD having a pattern shape larger than the prescribed dimensions is formed depending on a sticking position of the dust particle 31.

Plane pattern shapes of the lower electrode layer 21a forming the lower electrode 5 of the thin film diode (TFD), the lower electrode layer 21b forming the lower layer of the signal electrode 13, and the lower electrode layer 21c which is formed in surplus are respectively illustrated by solid lines and broken lines in FIG. 1, and hatching is made in the region which finally remains.

Thereafter, the surfaces of the lower electrode layers 21a to 21c are subject to an anodic oxidation treatment, thereby forming the anodic oxidation layer 7 serving as a nonlinear resistor layer as shown in FIG. 3. The anodic oxidation treatment is performed using an aqueous solution of citric acid of 0.1 wt % concentration as an anodic oxidation liquid.

At this time, the anodic oxidation voltage is set to 18 V so that the anodic oxidation layer 7 has a thickness of 35 nm and it is increased at a speed of 0.2. V/min, thereby forming the anodic oxidation layer 7 with a one hour fixed voltage.

Thereafter, the transparent electrode film 24 made of indium tin oxide (ITO) is formed on the entire surface as shown in FIG. 4. The transparent electrode film 24 is formed in a thickness of 100 nm by introducing argon gas containing oxygen ranging from 0.5 to 1% in a sputtering chamber for the sputtering treatment by controlling the sputtering pressure to 10 mTorr.

Next, the photoresist is formed on the entire surface of the transparent electrode film 24 by a spin coating method, and an exposing and developing treatment is performed using a second photo mask, thereby forming a second photoresist 25.

The transparent electrode film 24 is subject to a patterning treatment using the second photoresist 25 as an etching mask. The etching treatment of the transparent electrode film 24 is performed by a wet etching technique using a liquid mixture of ferric chloride and hydrochloric acid.

Alternatively, it is possible to perform the patterning treatment with a dry etching technique where the etching treatment of the transparent electrode film 24 is performed by introducing methane at a flow rate of 300 cc/min in an etching chamber of an etching device having a parallel plane type electrode structure while the pressure is adjusted to range from 10 to 30 mTorr with an RF power of 3 kW applied to the cathode, and an etching substrate being placed on the cathode.

Figure 5:
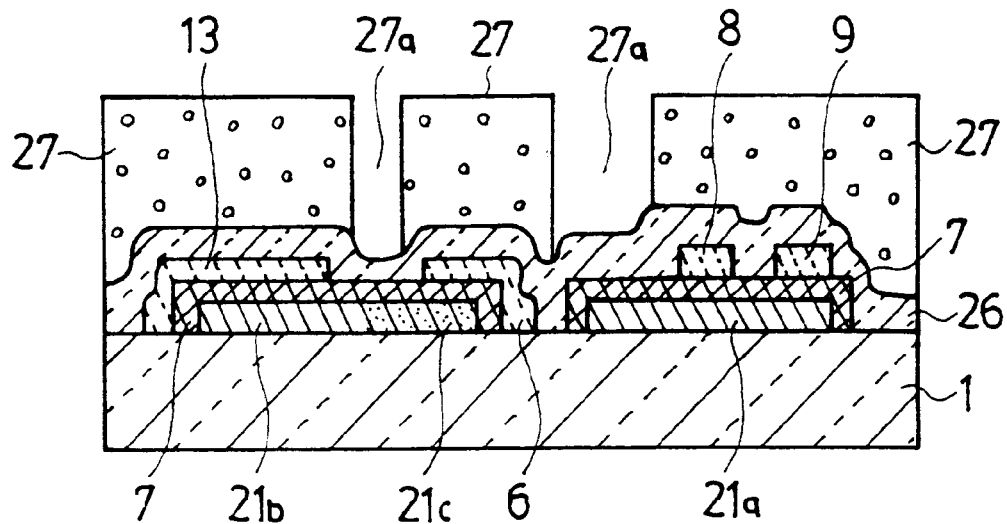

Thereafter, the upper electrodes 8 and 9 of the first and second thin film diodes, the picture-element electrode 6 and the signal electrode 13 are formed from the transparent electrode film 24 as shown in FIG. 5 by removing the second photoresist 25 by a wet etching technique.

Successively, the protection film 26 made of tantalum pentoxide is formed on the entire surface. The protection film 26 is formed in a thickness of 100 nm by a sputtering treatment where argon gas containing oxygen at 3% is introduced into a vacuum chamber at a pressure of 5 mTorr.

Successively, the photoresist is formed on the entire surface of the protection film 26 by a spin coating method, and an exposing and developing treatment is performed using a third photo mask, thereby forming a third photoresist 27 which was subject to a patterning treatment at the opening portions 27a as shown in FIG. 5.

The patterned shapes of the opening portions 27a of the third photoresist 27 are the same as those of the aforementioned openings 36a to 36e of the opening portion 36 formed on the protection film 26 (as illustrated by an imaginary line and points in FIG. 1).

Thereafter, sulfur hexafluoride, helium and oxygen are introduced into an etching chamber of an etching device having a parallel plate type electrode structure respectively at a flow rate of 200 cc/min, 20 cc/min and 30 cc/min while the pressure in the etching chamber is kept at 50 mTorr with an RF power of 1 kW applied thereto, using the third photoresist 27 as an etching mask, thereby patterning the tantalum pentoxide serving as the protection film 26.

As a result, the portion exposed from the opening portions 27a of the third photoresist 27 of the protection film 26 are subject to etching, thereby forming the opening portion 36 composed of the openings 36a to 36e as described before.

At that time, when the overetching treatment is performed for a period of 10 to 20% increase of a sufficient etching time, it is possible to remove the connection part 21d of the lower electrode layer to be exposed inside each opening 36b and the remaining portion including the anodic oxidation layer 7 of the lower electrode layer material 21 exposed inside each of the openings 36b to 36e. However, in this etching treatment, the remaining portion of the transparent electrode film 24 forming the picture-element electrode 6 and the signal electrode 13 is not etched.

Whereupon, as shown in three dotted one chain line in the plan view in FIG. 1, a resin film 37 is formed to cover the opening 36a over the driving IC connection part 29 by a printing treatment. The resin film 37 serves to prevent the transparent electrode film forming the terminal of the driving IC connection part 29 from being etched with a subsequent etching treatment.

Thereafter, the remaining portion of the transparent electrode film 24 exposed inside the openings 36b to 36e of the opening portion 36 is removed by etching with a wet etching technique using a liquid mixture of ferric chloride and hydrochloric acid.

The removal of the remaining portion of the transparent electrode film 24 by etching may be performed by a dry etching technique.

With these etching treatments, the connection part 21d between the lower electrode layer 21a and the lower electrode layer 21b of the signal electrode 13 is removed, and the lower electrode layer 21a is separated from the lower electrode layer 21b of the signal electrode 13, thereby forming the island-shaped lower electrode 5 for the first and second TFDs 11 and 12, and the anomalous thin film diode part 30 is separated from the signal electrode 13 as shown in FIGS. 1 and 6, thereby removing the remaining portions of the transparent electrode film 24 and lower electrode layer material 21 which cause defects such as the short circuit 32 between the picture-elements, the short circuit 33 between the signal electrode and the picture-element, or the short circuit 34 between the signal electrodes.

Accordingly, even if these short circuits occur, they are shut off and the short circuit conditions are eliminated.

Finally, when the third photoresist 27 and the resin film 37 are removed, the structure becomes as shown in FIG. 6. In such a manner, two thin film diodes each constituting the switching circuit for each picture-element can be formed using three photo masks.

Further, as a method of producing the liquid crystal display device other than the method set forth above, it may be possible to employ a wet etching technique for removing the third photoresist 27 upon completion of etching of the protection film 26 while employing a liquid mixture of ferric chloride and hydrochloric acid using the protection film 26 and the resin film 32 as an etching mask, or to employ a dry etching technique for removing the remaining portion of the transparent electrode film 24 exposed inside each of the openings 36b to 36e of the protection film 26 and then removing the resin film 37.

The liquid crystal display device and the method of producing the same according to this embodiment can remove the region having short circuit defects of the lower electrode layer material 21 and the transparent electrode film 24 using the third photoresist 27 as a mask without increasing the number of etching masks in the conventional producing steps. Consequently, the occurrence of the display line defects can be minimized.

Further, it is possible to produce a liquid crystal display device having less line defects with high quality merely by removing the short circuit defects of the lower electrode layer material 21 when the protection film 26 is etched without forming the resin film 37 for covering the opening 36a relative to the driving IC connection part 29 by the printing treatment.

Embodiment Using One TFD for One Picture-Element

Figure 23:
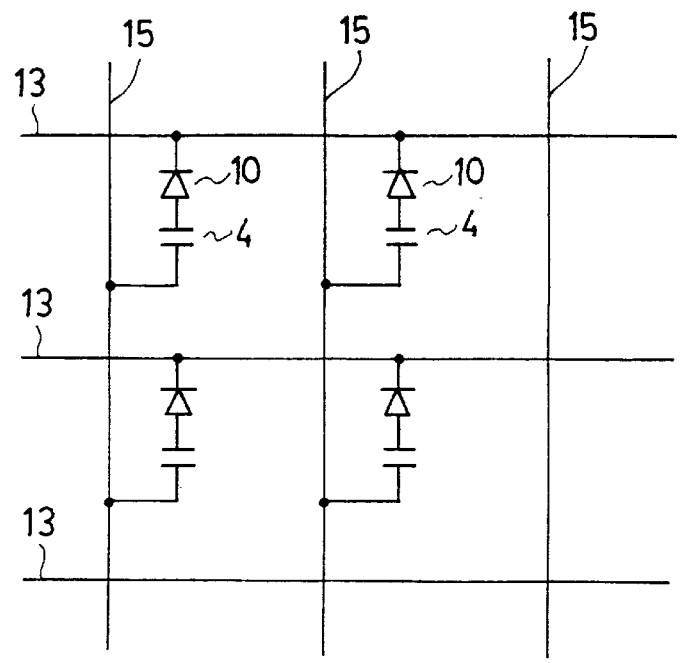
FIG. 23 is an equivalent circuit of another example of a liquid crystal display device using conventional thin film diodes like FIG. 22.
Figure 24:
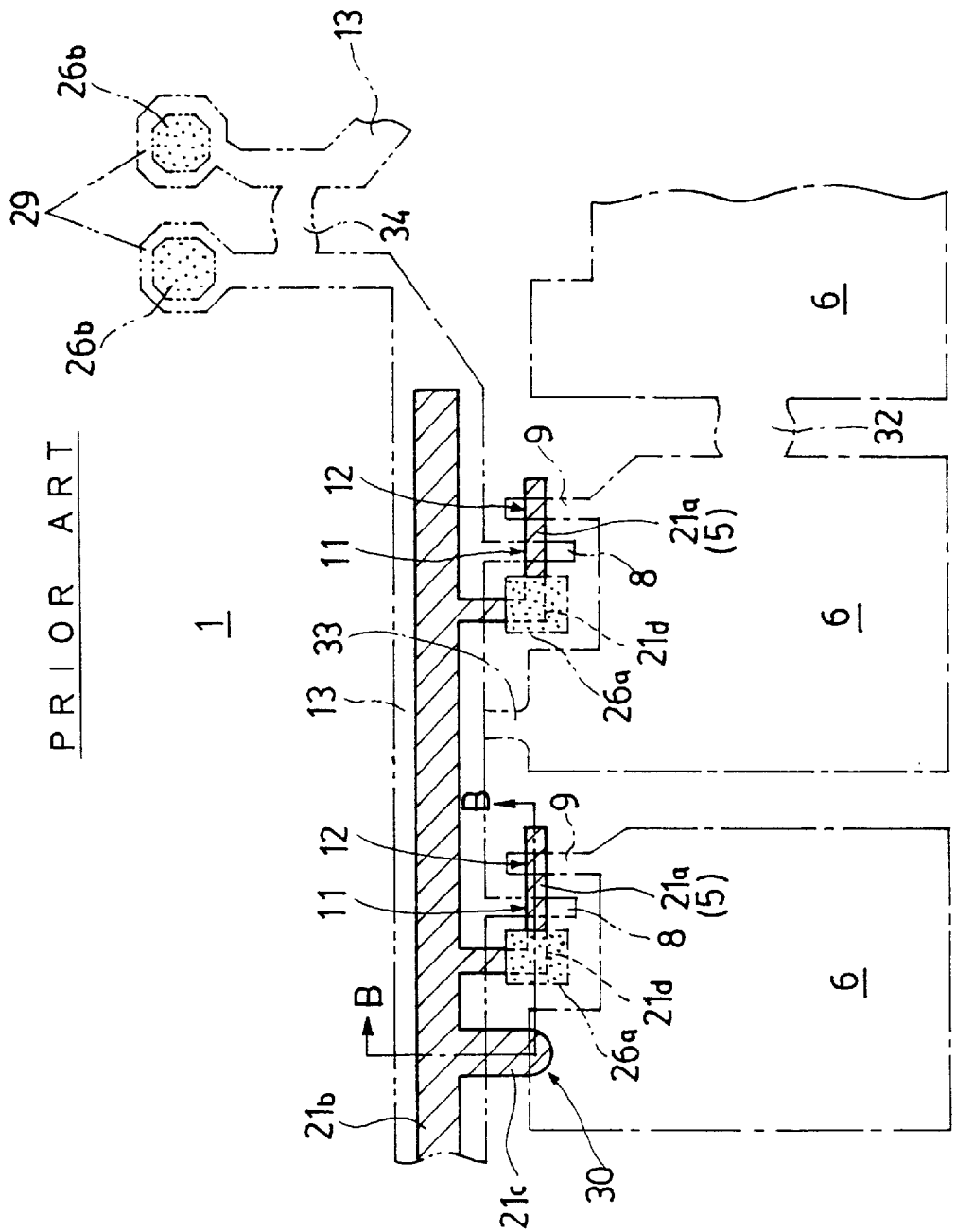
FIG. 24 is a plan view for explaining a method of fabricating the conventional thin film diodes when producing the liquid crystal display device as shown in FIGS. 20 to 22.

The aforementioned structure of liquid crystal display device and the method of producing the same can be also applied to a liquid crystal display device using one TFD for one picture-element as shown in an equivalent circuit in FIG. 23.

Figure 7:
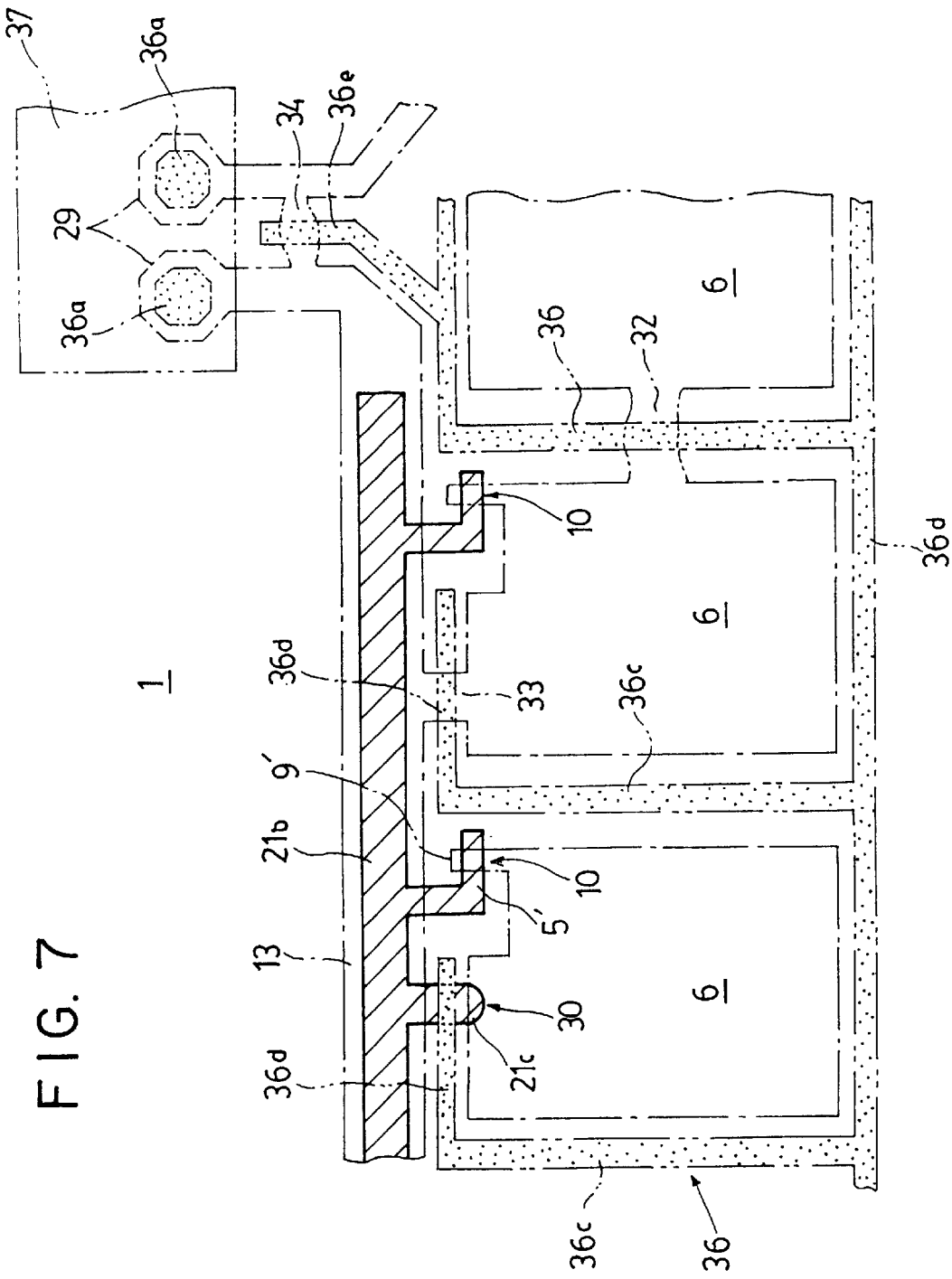
FIG. 7 is a partial plan view showing another embodiment of a liquid crystal display device using thin film diodes of the present invention.

FIG. 7 is a view of a liquid crystal display device using one TFD for one picture-element to which the present invention is applied like in FIG. 1. Components corresponding to those in FIG. 1 are denoted by the same numerals and the explanation thereof is omitted.

The thin film diode (TFD) 10 of the liquid crystal display device comprises a lower electrode 5' formed to extend from the lower electrode layer 21b of a signal electrode 13, an upper electrode 9' formed to extend from the picture-element electrode 6 and an anodic oxidation layer, not shown, provided on the lower electrode 5'. The lower electrode 5' is not necessarily separated from the lower electrode layer 21b of the signal electrode 13, and hence it is the same as the previous embodiment except that the opening 36b shown in FIG. 1 is not defined in the opening portion 36 of the protection film like the previous embodiment.

The steps of producing the liquid crystal display device are substantially the same as those of the previous embodiment except for the patterns for forming the lower electrode and the upper electrode for fabricating the TFD 10.

Also in this embodiment, the remaining portions of all the electrode layers inside the openings 36c to 36e of the opening portion 36 of the protection film are removed by etching, the anomalous thin film diode part is cut off, and hence even if there occur the defects such as the short circuit 32 between the picture-elements, the short circuit 33 between the signal electrode and the picture-element and the short circuit 34 between the signal electrodes, they are all shut off and eliminated, so that the line defect does not occur.

Embodiment of a Liquid Crystal Display Device Using TFTs

Next, an embodiment of the invention which is applied to a liquid crystal display device using thin film transistors (TFTs) as switching elements is explained with reference to FIGS. 8 to 19.

Figure 8:
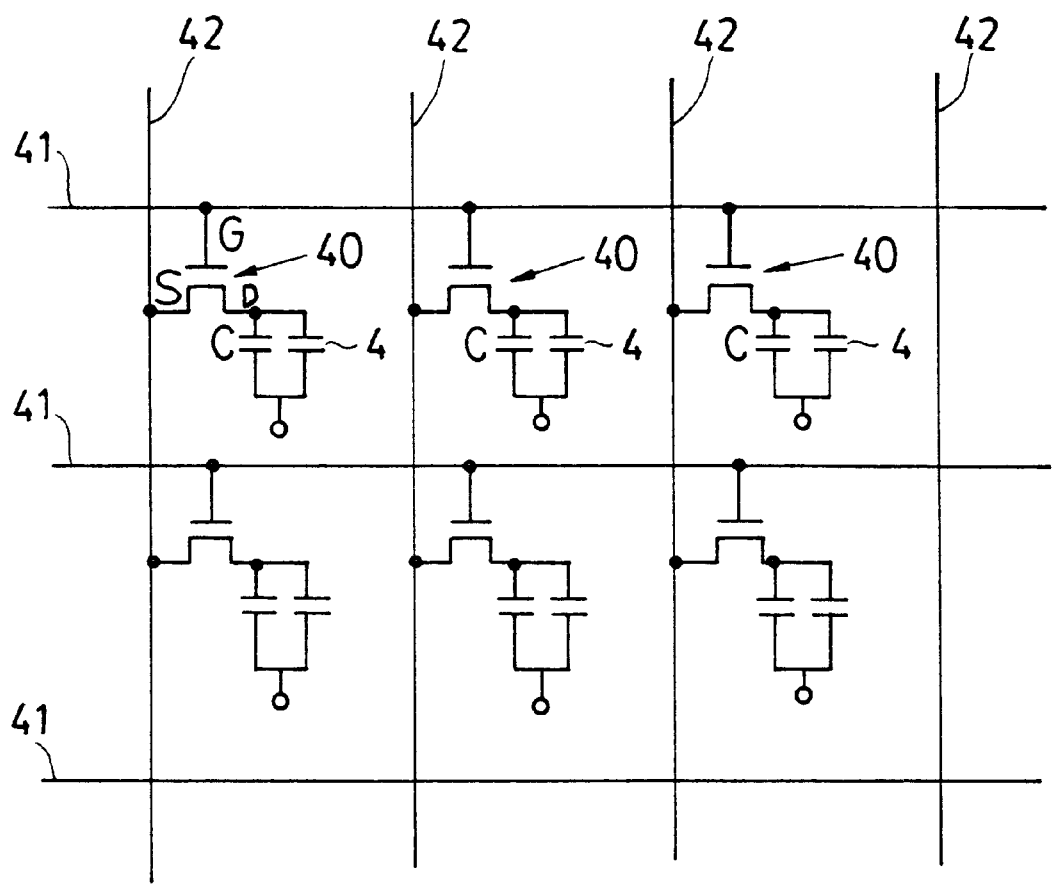
FIG. 8 is an equivalent circuit of the liquid crystal display device using thin film transistors.

The liquid crystal display device of this embodiment is provided with thin film transistors (TFTs) 40 in a matrix shape between the scanning electrode 41 and the signal electrode 42 as shown in the equivalent circuit in FIG. 8. A source electrode S of the thin film transistor 40 is connected with the signal electrode 42 and a drain electrode D is connected with an accumulation capacitor C and the liquid crystal 4.

The thin film transistor 40 is turned on by a gate voltage applied to the gate electrode G of the thin film transistor 40 via the scanning electrode 41 during scanning, thereby enabling sufficient charging and discharging relative to the liquid crystal 4 and the accumulation capacitor C by the signal voltage applied via the signal electrode 42. During non-scanning, the thin film transistor 40 is turned off so that electrical charge accumulated in the liquid crystal 4 and the accumulation capacitor C is sufficiently held.

The structure of the liquid crystal display device provided with the thin film transistors 40 as switching elements for each picture-element is explained with reference to FIG. 9 which is a partial plan view of an active matrix substrate and FIG. 10 which is an enlarged cross-sectional view taken along the line E—E in FIG. 9.

The gate electrode G and the scanning electrode 41 respectively made of the same material are provided on the substrate 1 made of transparent glass. An anodic oxidation layer 43 is provided on the surfaces of the gate electrode G and the scanning electrode 41.

Further, an insulating coating film 45 is provided so that driving IC connection parts 44a and 44b serving as regions on which a driving IC (semiconductor device) for driving the liquid crystal display device is mounted are opened. A gate insulating film 46 is structured by the anodic oxidation layer 43 and the insulating coating film 45.

A semiconductor layer 47 is provided on the gate insulating film 46. A channel region 47c, a source region 47s and a drain region 47d are respectively provided on the semiconductor layer 47.

Further, a channel stop layer 48 is provided on the semiconductor layer 47. The channel stop layer 48 is provided for preventing impurities contained in an ohmic contact layer 49 provided thereon from diffusing to the channel region 47c of the semiconductor layer 47 so that the characteristics of the thin film transistor, particularly a threshold voltage thereof, are not varied. Accordingly, a plane pattern shape of the channel stop layer 48 is formed on the channel region 47c at the substantially central portion of the semiconductor layer 47 so as to prevent impurities from being diffused from the ohmic contact layer 49. The ohmic contact layer 49 serves to reduce a connection resistance between the source electrode S, the drain electrode D and the semiconductor layer 47 respectively provided thereon.

Further, there is provided a picture-element electrode 50 comprising a transparent electrode film. The accumulation capacitor C is provided at a region opposing the thin film transistor inside the picture-element whereby the accumulation capacitor C becomes the capacitor comprising a [metal-insulating film-metal] structure formed by the large width part 41a of the scanning electrode 41, the gate insulating film 46 and the picture-element electrode 50 as illustrated by broken lines in FIG. 9.

The source electrode S and the drain electrode D are provided on the semiconductor layer 47 in which the drain electrode D is structured to connect with the picture-element electrode 50. The source electrode S is formed in a pattern shape so as to be integrated with the signal electrode 42.

Further, a protection film 51 is provided on the entire surface of the substrate 1 on which each electrode is formed as set forth above. An opening portion 52 having a slit shape is defined in the protection film 51. The opening portion 52 comprises, as shown by an imaginary line and points in FIG. 9, an opening 52a between the signal electrode 42 and the signal electrode 42, an opening 52b between the scanning electrode 41 and the scanning electrode 41, an opening 52c between the scanning electrode 41 and the signal electrode 42, an opening 52d between the signal electrode 42 and the picture-element electrode 50, an opening 52e between the scanning electrode 41 and the picture-element electrode 50, and openings 52f and 52g corresponding to the driving IC connection parts 44a and 44b. The protection film 51 per se is not illustrated for convenience of the illustration in FIG. 9, but the opening portion 52 alone is illustrated.

With the provision of the opening portion 52 having the slit shape being defined in the protection film 51, short circuit defects 53a to 53e respectively occurring between the signal electrode 42 and the signal electrode 42, between the scanning electrode 41 and the scanning electrode 41, between the scanning electrode 41 and the signal electrode 42, between the signal electrode 42 and the picture-element electrode 50, and between the scanning electrode 41 and the picture-element electrode 50 can be eliminated by etching, i.e., an overetching treatment used when forming the opening portion 52 and an etching treatment used after the formation of the opening portion 52.

Accordingly, the cause of occurrence of the display line defect of the liquid crystal display device can be eliminated, thereby providing a liquid crystal display device having excellent display quality.

The openings 52f and 52g of the protection film 51 are provided for exposing the transparent electrode film forming the terminals of the driving IC connection parts 44a and 44b.

Method of Producing a Liquid Crystal Display Device Using TFTs

Next, a method of producing a liquid crystal display device provided with the thin film transistors having the aforementioned structure will be now described with reference to FIG. 9, which is a plan view thereof, and Figs. 11 to 19 which are respectively enlarged cross sectional views taken along the line E—E in FIG. 9 and showing each producing step.

Figure 11:
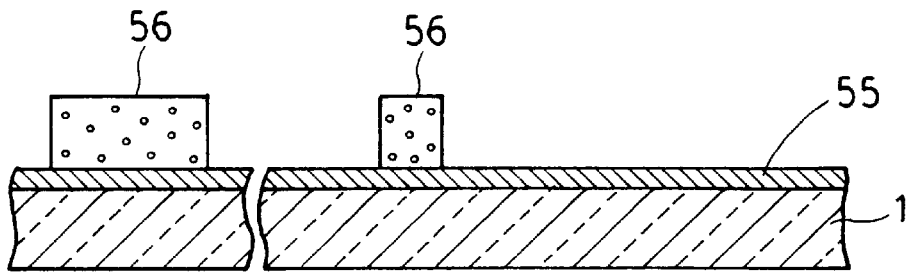
FIGS. 11 to 19 are cross sectional views for explaining steps of producing the liquid crystal display device like FIG. 10.

First of all, as shown in FIG. 11, tantalum serving as a gate electrode material 55 forming a scanning electrode material is formed on the entire surface of the substrate 1 made of transparent glass by a sputtering treatment in the thickness ranging from 300 to 500 nm. The gate electrode material 55 may be made of molybdenum or aluminium.

Thereafter a positive photoresist is formed on the entire surface of the gate electrode material 55 by a spin coating method, and an exposing and developing treatment is performed using a first photo mask, and then the photoresist is subject to a patterning treatment in the shape of the gate electrode and scanning electrode, thereby forming a first photoresist 56.

Figure 12:
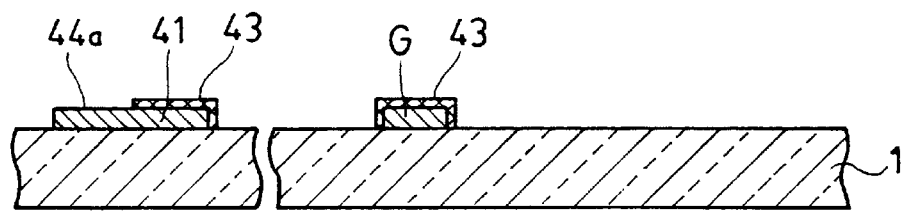

Next, sulfur hexafluoride, helium and oxygen are introduced in an etching chamber of an etching device having a parallel plane type electrode structure as an etching gas respectively at the flow rate of 200 cc/min, 20 cc/min and 30 cc/min, while the pressure in the etching chamber is kept at 50 mTorr with an RF power of 1 kW applied thereto, and then the gate electrode material 55 made of tantalum is etched using the first photoresist 56 as an etching mask, thereby forming the gate electrode G and the scanning electrode 41 as shown in FIG. 12.

A driving IC connection part 44a which is a region for connecting the driving IC (semiconductor device) for driving the liquid crystal display device is simultaneously formed on the scanning electrode 41.

Figure 9:
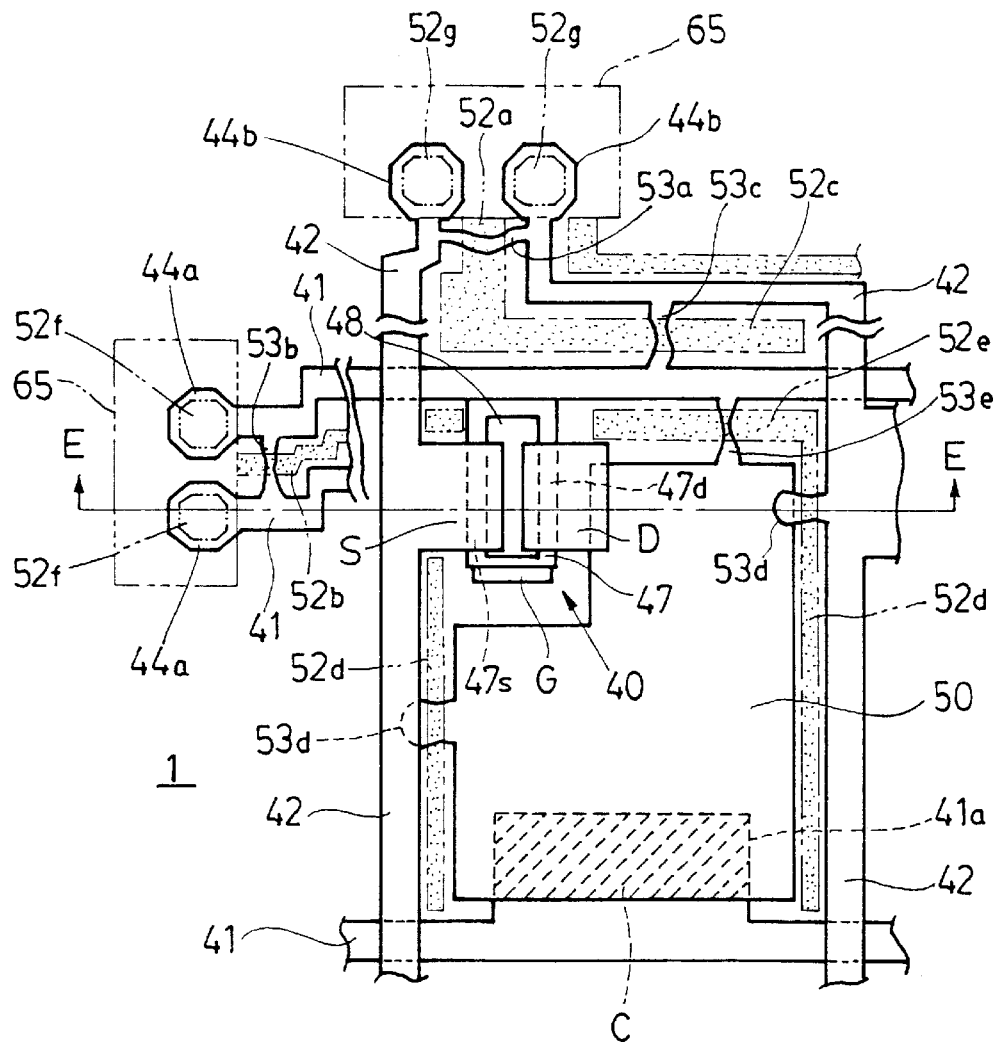
FIG. 9 is a partial plan view of a substrate of an active matrix substrate showing the embodiment of the liquid crystal display device using the thin film transistors.

Further, as shown in FIG. 9, a part of the adjoining scanning electrodes 41 is formed in a pattern shape having the large width part 41a so as to protrude toward the picture-element electrode 50 formed later, thereby forming the lower electrode of the accumulation capacitor C.

Thereafter, the first photoresist 56 is removed, and the driving IC connection part 44a is subject to an anodic oxidation treatment while it is masked by the resin film, thereby forming the anodic oxidation layer 43 on the surfaces of the gate electrode G and the scanning electrode 41 in a thickness ranging from 100 to 150 nm as shown in FIG. 12. The anodic oxidation layer 43 is formed using an aqueous solution of citric acid of 0.1 wt % as an anodic oxidation liquid while the anodic oxidation voltage is set to 30 V and is increased at a speed of 0.6 cc/min with a fixed voltage for one hour.

The anodic oxidation layer constituting the gate insulating film lower layer may be effective even if it is formed by thermal oxidation in an atmosphere of oxygen.

Figure 13:
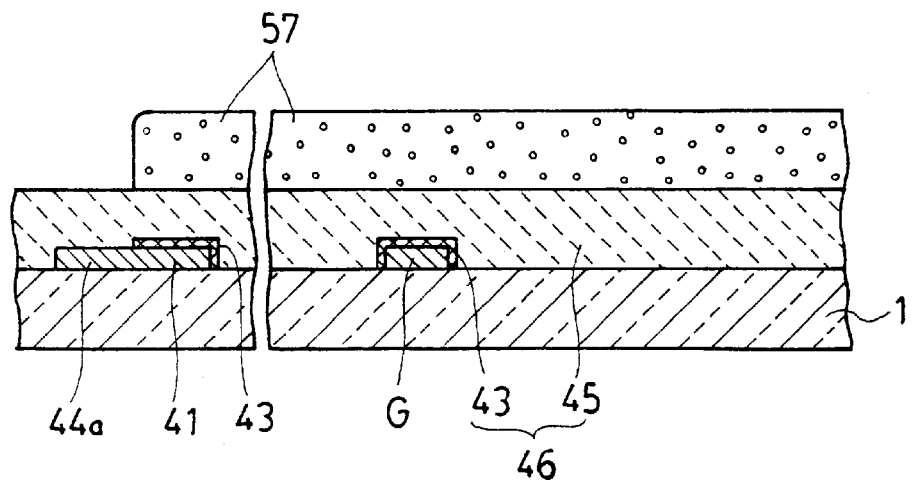

Thereafter, a silicon nitride film is formed on the entire surface by a plasma chemical vapor deposition method in a thickness ranging from 200 to 300 nm as the insulating coating film 45 constituting the gate insulating film upper layer as shown in FIG. 13. The formation of the silicon nitride film is performed by the chemical vapor phase reaction between silane gas and ammonia gas as the following:

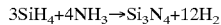

$$3SiH_4 + 4NH_3 \rightarrow Si_3N_4 + 12H_2$$

The gate insulating film 46 is structured by the anodic oxidation layer 43 on the gate electrode G and the insulating coating film 45.

Thereafter, a positive photoresist is formed on the entire surface of the gate insulating film by a spin coating method, and an exposing and developing treatment is performed using a second photo mask, and then a photoresist is subject to a patterning treatment so that the driving IC connection parts 44a of the scanning electrode 41 is opened, thereby forming a second photoresist 57 as shown in FIG. 13.

Further, carbon tetrafluoride and oxygen are introduced into an etching chamber of an etching device having a parallel plane type electrode structure as an etching gas, respectively at a flow rate of 200 cc/min and 30 cc/min, while the pressure in the etching chamber is kept at 50 mTorr with an RF power of 1 kW applied thereto, and then the gate insulating film 46 is etched using the second photoresist 57 as an etching mask, thereby forming the gate insulating film 46 so that the driving IC connection part 44a is opened.

When the driving IC connection part 44a of the gate insulating film 46 is removed, the driving IC for driving the liquid crystal display device can be directly mounted on the tantalum film constituting the scanning electrode 41.

Figure 14:
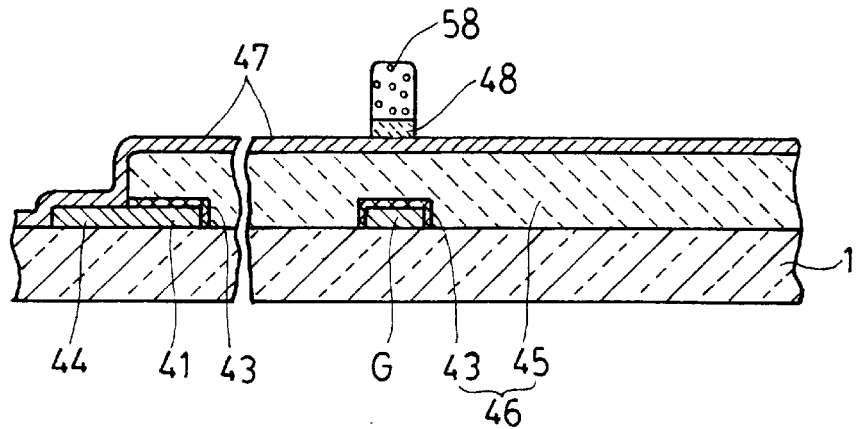

Thereafter, the second photoresist 57 is removed, and then the semiconductor layer 47 forming the channel region 47c, the source region 47s and the drain region 47d as shown in FIG. 14 and the silicon nitride film forming the channel stop layer 48 are continuously formed by a plasma chemical vapor deposition method.

At this time, the semiconductor layer 47 is formed in a thickness of 100 nm and the channel stop layer 48 made of silicon nitride is formed in a thickness of 100 nm. The semiconductor layer 47 is formed of the silicon film formed by the vapor phase reaction with silane gas and the formation of silicon nitride film is performed by the chemical vapor reaction between silane gas and ammonia gas as set forth above.

Thereafter, a positive photoresist is formed on the entire surface of the silicon nitride film in the spin coating method, and an exposing and developing method is performed using a third photo mask, and then a patterning treatment is performed so that the photoresist remains on a region where the channel stop layer 48 is formed, thereby forming a third photoresist 58 as shown in FIG. 14.

Successively, carbon tetrafluoride and oxygen are introduced into an etching chamber of an etching device having a parallel plane type electrode structure as an etching gas, respectively at the flow rate of 200 cc/min and 30 cc/min, while the pressure in the etching chamber is kept at 50 mTorr with an RF power of 1 kW applied thereto, and then the silicon nitride film is etched using the third photoresist 58 as an etching mask, thereby forming a channel stop layer 48 as shown in FIG. 14.

The channel stop layer 48 serves to keep the threshold voltage of the thin film transistor from being varied when the impurities contained in the ohmic contact layer 49 including the impurities which are formed in the following steps are diffused into the channel region 47c of the semiconductor layer 47, and also serves as an etching stopper when the source electrode S and the drain electrode D are formed by the etching treatment.

Figure 15:
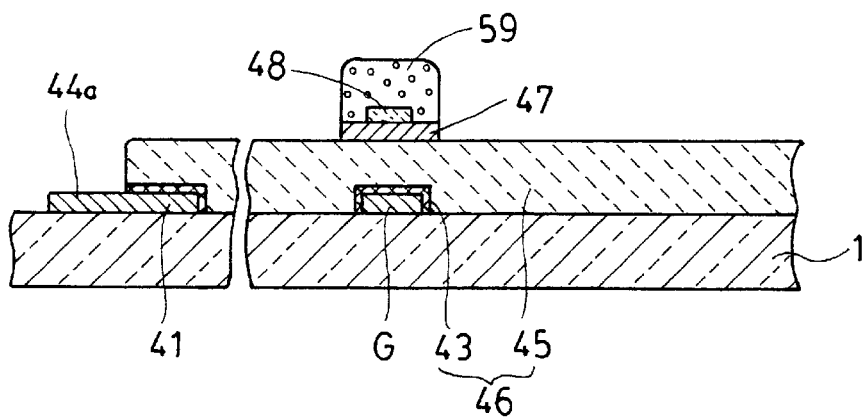

Next, after the third photoresist 58 is removed, a positive photoresist is formed on the entire surface by a spin coating method, and then an exposing and developing treatment is performed using a fourth photo mask, and a patterning treatment is performed so that the photoresist remains on a region forming the gate electrode, thereby forming a fourth photoresist 59 shown in FIG. 15.

Thereafter, carbon tetrafluoride and oxygen are introduced into an etching chamber of an etching device having a parallel plane type electrode structure as an etching gas, respectively at the flow rate of 200 cc/min and 30 cc/min, while the pressure in the etching chamber is kept at 50 mTorr with an RF power of 1 kW applied thereto, and then the silicon film is etched using the fourth photoresist 59 as an etching mask, thereby forming the semiconductor layer 47.

Next, a silicon film containing conductive n-type impurity which becomes the ohmic contact layer 49 is formed on the entire surface in the thickness of 30 nm by a plasma chemical vapor deposition method. The formation of the silicon film containing the n-type impurity is performed by the vapor phase reaction between the silane gas, phosphine gas and hydrogen gas.

Figure 16:
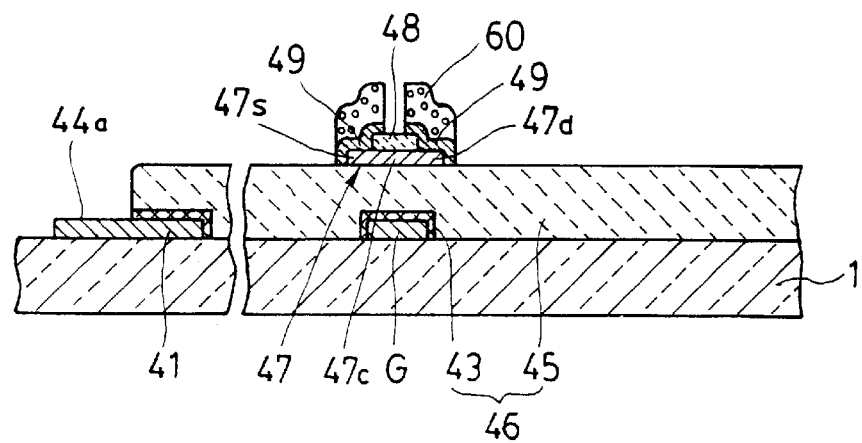

Thereafter, a positive photoresist is formed on the entire surface of the silicon film in a spin coating method, and after an exposing and developing treatment is performed using the fifth photo mask, a patterning treatment is performed so that the photoresist remains on the region where the ohmic contact layer is formed, thereby forming a fifth photoresist 60 as shown in FIG. 16.

Thereafter, carbon tetrafluoride and oxygen are introduced into an etching chamber of an etching device having a parallel plane type electrode structure as an etching gas, respectively at the flow rate of 200 cc/min and 30 cc/min, while the pressure in the etching chamber is kept at 50 mTorr with an RF power of 1 kW applied thereto, and then the n-type silicon film is etched using the fifth photoresist 60 as an etching mask, thereby forming an ohmic contact layer 49 on the source region 47s, the drain region 47d, and the channel stop layer 48 of the semiconductor layer 47 as shown in FIG. 16.

Next, the fifth photoresist 60 is removed, and the transparent electrode film forming the picture-element electrode 50 made of indium tin oxide (ITO) is formed on the entire surface. The formation of the transparent electrode film having a thickness of 100 nm is performed by introducing argon gas containing 0.5 to 1% of oxygen by a sputtering treatment.

Figure 17:
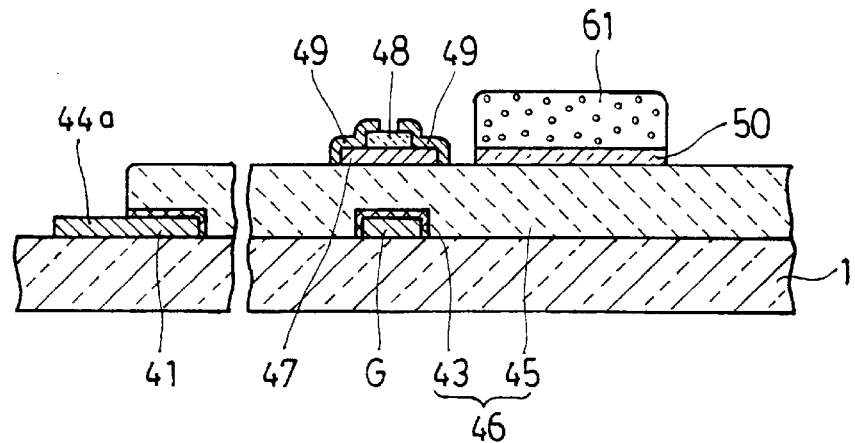

Thereafter, a positive photoresist is formed on the entire surface of the transparent electrode film in a spin coating method, and an exposing and developing treatment is performed using a sixth photomask, and then a patterning treatment is performed so that the photoresist remains on the region where the picture-element electrode 50 is formed, thereby forming the sixth photoresist 61 as shown in FIG. 17.

Then, the transparent electrode film is subject to a patterning treatment using the sixth photoresist 61 as an etching mask, thereby forming the picture-element electrode 50 and an upper electrode on the accumulation capacitor C (see FIG. 9). The etching treatment of the transparent electrode film is performed by a wet etching technique using a liquid mixture of ferric chloride and hydrochloric acid.

Alternatively, it is possible to perform the treatment with a dry etching technique where the etching treatment of the transparent electrode film for forming the picture-element electrode 50 is performed by introducing methanol at the flow rate of 300 cc/min in an etching chamber of an etching device having a parallel plane type electrode structure while the pressure is adjusted to range from 10 to 30 mTorr with an RF power of 3 kW applied to the cathode, and an etching substrate is placed on the cathode.

It is possible to constitute the accumulation capacitor C (the gate insulating film 46 is not illustrated) having a [metal-insulating film-metal] structure comprising the scanning electrode 41, the gate insulating film 46 and the transparent electrode film (ITO) of the picture-element electrode 50 by the etching treatment of the transparent electrode film as shown in FIG. 9.

Thereafter, the sixth photoresist 61 is removed, and the molybdenum film as a material of the source electrode S, the drain electrode D and the signal electrode 42 is formed in a thickness ranging from 100 to 200 nm by a sputtering treatment. Titanium, aluminum, or tungsten may be used as the material for the source electrode S, the drain electrode D and the signal electrode 42.

Figure 18:
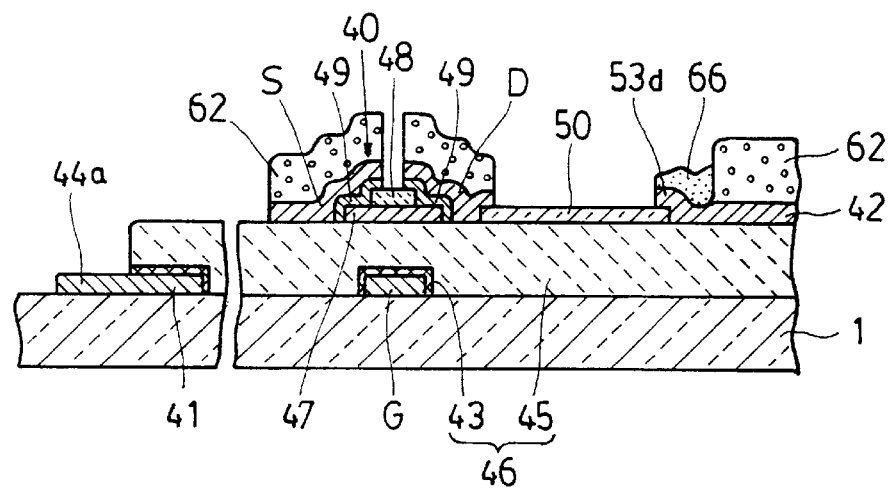

Thereafter a positive photoresist is formed on the entire surface of the molybdenum film in a spin coating method, and then an exposing and developing treatment is performed using a seventh photo mask, and the photoresist is subject to a patterning treatment so that a region where the source electrode S, the drain electrode D and the signal electrode 42 are formed remains, thereby forming a seventh photoresist 62 as shown in Fig. 18.

Thereafter, sulfur hexafluoride, helium and oxygen are introduced into an etching chamber of an etching device having a parallel plane type electrode structure as an etching gas, respectively at the flow rate of 200 cc/min, 20 cc/min and 30 cc/min, while the pressure in the etching chamber is kept at 50 mTorr with an RF power of 1 kW applied thereto, and then the molybdenum film is etched using the seventh photoresist 62 as an etching mask, thereby forming the source electrode S, the drain electrode D and the signal electrode 42 of the thin film transistor as shown in FIG. 18.

Next, after the seventh photoresist 62 is removed, the protection film 51 made of silicon nitride film (see FIG. 19) is formed on the entire surface in a thickness ranging from 100 to 200 nm by the vapor phase reaction between silane gas and ammonia gas in a plasma chemical vapor deposition method.

Figure 19:
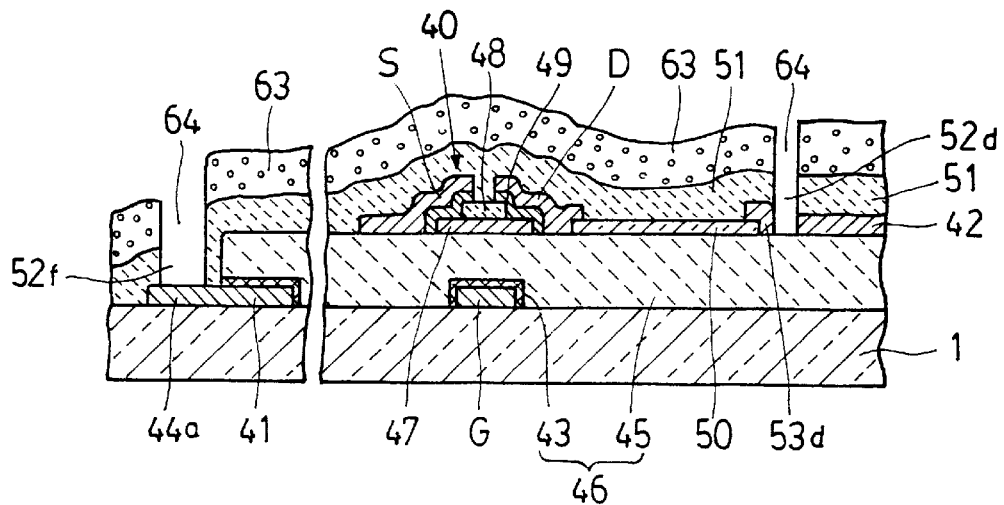
Figure 20:
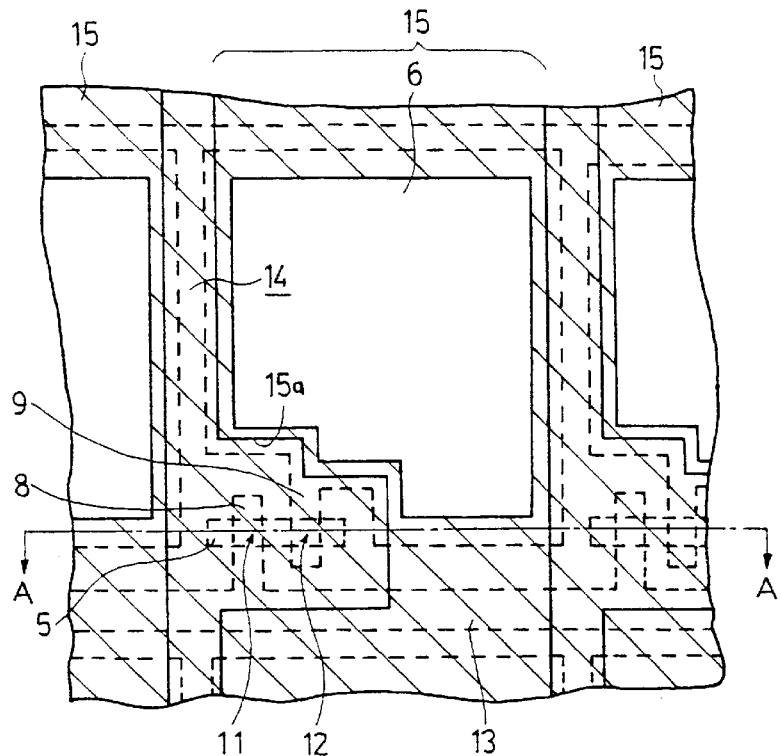
FIG. 20 is a partial plan view showing an example of a liquid crystal display device using conventional thin film diodes.

Thereafter, a positive photoresist is formed on the entire surface of the protection film 51 in a spin coating method,
and an exposing and developing treatment is performed using an eighth photo mask, and then the photoresist is subject to a patterning treatment so as to form an opening portion 64 comprising each opening that corresponds to the openings 52a to 52g of the opening portion 52 defined in the protection film 51, thereby forming an eighth photoresist 63 as shown in FIG. 19.

Further, carbon tetrafluoride and oxygen are introduced into an etching chamber of an etching device having a parallel plane type electrode structure as an etching gas, respectively at the flow rate of 200 cc/min, 20 cc/min and 30 cc/min while the pressure in the etching chamber is kept at 50 mTorr with an RF power of 1 kW applied thereto, and then the silicon nitride film which is a protection film 51 is subject to a patterning treatment using the eighth photoresist 63 as an etching mask, thereby forming the opening portion 52 having a slit shape. At the same time the driving IC connection parts 44a and 44b are opened, thereby exposing the tantalum film or molybdenum film.

At this time, further the driving IC connection parts 44a and 44b are covered with a resin film (organic resin film) as shown by three-dotted one chain line in FIG. 9, and then an overetching treatment is performed for a period of 10 to 30% increase of a sufficient etching time, so that the remaining portions of the signal electrode material and the scanning electrode material in the short circuit region which are exposed inside of the openings 52a to 52e of the opening portion 52 are etched and removed.

Further, successively, a wet etching technique employing a liquid mixture of ferric chloride and hydrochloric acid is performed using the eighth photoresist 63 as an etching mask, thereby eliminating the short circuit defects of the transparent electrode film (the short circuit defects 53d, etc., caused by the masking owing to the sticking of the dust particle 66 shown in FIG. 18) which causes the short circuit between the picture-element electrode and the signal electrode or the short circuit between the scanning electrodes.

Alternatively, it is possible to etch and remove the transparent electrode film by a dry etching technique by introducing methane gas at the flow rate of 300 cc/min into an etching chamber of an etching device having a parallel plane type electrode structure while the pressure is adjusted to range from 10 to 30 mTorr with an RF power of 3 kW applied to the cathode.

Figure 10:
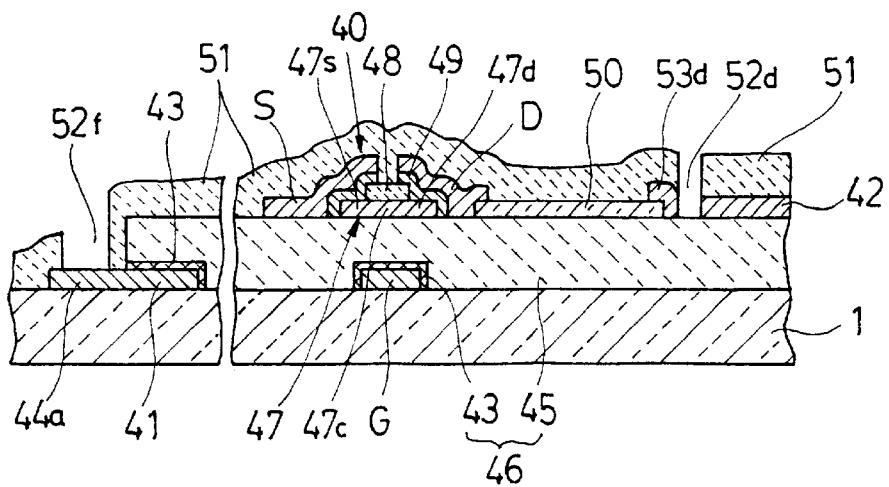
FIG. 10 is a cross sectional view taken along the line E—E in FIG. 9.

Thereafter, the eighth photoresist 63 is removed to obtain the active matrix substrate shown in FIG. 10. The active matrix substrate is opposed to the second substrate with a certain gap and a liquid crystal is sealed therebetween while deflector plates and a back light source are integrally provided, thereby constituting the liquid crystal display device.

Alternatively, the above-mentioned wet etching or dry etching technique may be performed using the protection film 51 as an etching mask after the eighth photoresist 63 is removed so as to remove the remaining portion of the transparent electrode film which is exposed inside the openings 52a to 5e of the opening portion 52 and which causes the short circuit defects.

When the overetching treatment is performed when the opening portion 52 is defined in the protection film 51 or the etching treatment is performed for etching the remaining portion of the transparent electrode, the short circuit 53a between the signal electrodes 42, the short circuit 53b between the scanning electrodes 41, the short circuit 53c between the scanning electrode 41 and the signal electrode 42, the short circuit 53d between the signal electrode 42 and the picture-element electrode 50 or the short circuit 53e between the scanning electrode 41 and the picture-element electrode 50 are all shut off and these short-circuited conditions can be eliminated even if they occur owing to the poor patterning of the photoresist caused in the photoresist forming step.

Accordingly, the display defects can be remarkably reduced so that a liquid crystal display device having high display quality can be produced at a high yield.

Further, according to the aforementioned method of producing the liquid crystal display device, it is possible to eliminate the short circuit defects of the signal electrode material, scanning electrode material and transparent electrode film using the eighth photoresist 63 or the protection film 51 as an etching mask without increasing the number of masks or the number of coating film forming steps in the prior art production method. Accordingly, it is possible to produce the liquid crystal display device which has scarcely any display defects without increasing the cost thereof.

In the case of the liquid crystal display device employing the thin film transistors, the short circuit defects hardly occur between the scanning electrode 41 and the picture-element electrode 50 which are spaced from each other via the gate insulating film 46 or between the scanning electrode 41 and the signal electrode 42, leading to the result that the display defect can be reduced even if the openings 52a to 52e are not defined in the protection film 51. Accordingly, the opening of the insulating film can be formed only between the electrodes where the short circuits are liable to occur.

INDUSTRIAL APPLICABILITY

As is evident from the above explanation, according to the liquid crystal display device and the method of producing the same employing the thin film diodes or thin film transistors as switching elements, the short circuit defects between the picture-elements or between the electrodes scarcely occur, thereby remarkably improving the display quality. Further, since production yield can be remarkably improved, the liquid crystal display device can be produced at low cost.

Accordingly, the present invention is very useful for improving the display quality and the productivity of monochrome or colored liquid crystal display devices which are widely used for display devices of watches, calculators, video cameras, and various other electronic devices.

What is claimed is:

1. A liquid crystal display device comprising a first transparent substrate and a second transparent substrate opposing each other with a certain gap, a liquid crystal filled between the first and second substrates, signal electrodes and picture-element electrodes forming each of a plurality of display picture-elements respectively disposed on the first substrate, thin film diodes provided between the signal electrode and each picture-element electrode as switching elements for controlling a flow of current to each picture-element electrode, an opposing electrode provided on the second substrate via each picture-element electrode on the first substrate and the liquid crystal, characterized in that a protection film is formed on an entire surface of the first substrate so as to cover the signal electrodes, each picture-element electrode and each thin film diode, an opening portion is provided to have openings in corresponding positions between the picture-element electrodes of the protection film, between the signal electrode and the picture-element electrode, and between the signal electrodes, and a remaining portion of electrode layer material forming the signal electrode and picture-element electrode inside the opening portions are removed by etching.

2. The liquid crystal display device according to claim 1, wherein two thin film diodes are provided between the signal electrode and each picture-element electrode with a back-to-back connection, a lower electrode common to the two thin film diodes and a lower electrode layer of the signal electrodes are connected with each other by a connection part for anodic oxidation treatment, the opening portion of the protection film has an opening in a position corresponding to the connection part, and the connection part inside the opening is removed by etching.

3. A method of producing a liquid crystal display device comprising a first transparent substrate and a second transparent substrate opposing each other with a certain gap, a liquid crystal filled between the first and second substrates, signal electrodes and picture-element electrodes forming each of a plurality of display picture-elements respectively disposed on the first substrate, thin film diodes provided between the signal electrode and each picture-element electrode as switching elements for controlling a flow of current to each picture-element electrode, an opposing electrode provided on the second substrate via each picture-element electrode on the first substrate and the liquid crystal, said method comprising:

a first step for forming a lower electrode layer material on the entire surface of the first substrate, comprising subjecting a first photoresist to a patterning treatment on the lower electrode layer material, performing an etching treatment using the first photoresist as an etching mask so as to form a lower electrode layer of the thin film diodes, and then removing the first photoresist;

a second step for forming an anodic oxidation layer on the surface of the lower electrode layer by an anodic oxidation treatment, said anodic oxidation layer serving as a non-linear resistor layer of the thin film diode;

a third step for forming a transparent electrode film on an entire surface of the first substrate on which the lower electrode layer and the anodic oxidation layer on the lower electrode layer are formed, comprising subjecting a second photoresist to a patterning treatment on the transparent electrode film, performing an etching treatment using the second photoresist as an etching mask to form an upper electrode, the signal electrodes and picture-element electrodes on the thin film diode, and then removing the second photoresist; and a fourth step for forming the protection film on the entire surface of the first substrate which was subject to the first and second steps, comprising subjecting a third photoresist to a patterning treatment on the protection film, performing an etching treatment using the third photoresist as an etching mask to define openings in corresponding positions between the picture-element electrodes of the protection film, between the signal electrode and the picture-element electrode, and between the signal electrodes, and removing remaining portions of the lower electrodes and the transparent electrode film inside each opening.

4. The method of producing a liquid crystal display device according to claim 3, wherein the fourth step comprises:

forming the protection film on the entire surface of the first substrate which was subject to the first and second steps, subjecting a third photoresist to a patterning treatment on the protection film, performing an etching treatment using the third photoresist as an etching mask to define openings in corresponding positions between the picture-element electrodes of the protection film, between the signal electrode and the picture-element electrode, and between the signal electrodes, performing an overetching treatment to remove the remaining portion of the lower electrode layer inside each opening; and removing the remaining portion of the transparent electrode film inside each opening of the protection film by etching, and then removing the third photoresist.

5. A method of producing a liquid crystal display device according to claim 4, wherein in the first step, a connection part is formed for connecting the lower electrode layer common to two thin film diodes provided with back-to-back connection as the thin film diodes with the lower electrode layer of the signal electrode for the anodic oxidation treatment;

in the third step, each upper electrode of the two thin film diodes, the signal electrodes and the picture-element electrodes is formed by etching the transparent electrode film; and in the fourth step, openings in a position corresponding to the connection part of the lower electrode layer of the protection film are defined by etching using the third photoresist as an etching mask, and the connection part is removed when removing the remaining portion of the lower electrode layer inside each opening of the protection film by performing an overetching treatment.

6. The method of producing a liquid crystal display device according to claim 3, wherein the fourth step comprises:

forming the protection film on the entire surface of the first substrate which was subject to the first and second steps, subjecting a third photoresist to a patterning treatment on the protection film, performing an etching treatment using the third photoresist as an etching mask to define openings in corresponding positions between the picture-element electrodes of the protection film, between the signal electrode and the picture-element electrode, and between the signal electrodes, performing an overetching treatment to remove the remaining portion of the lower electrode layer inside each opening, and then removing the third photoresist; and performing an etching treatment using the protection film as an etching mask to remove the remaining portion of the transparent electrode film inside each opening of the protection film.

7. A method of producing a liquid crystal display device according to claim 6, wherein in the first step, a connection part is formed for connecting the lower electrode layer common to two thin film diodes provided with back-to-back connection as the thin film diodes with the lower electrode layer of the signal electrode for the anodic oxidation treatment;

in the third step, each upper electrode of the two thin film diodes, the signal electrodes and the picture-element electrodes is formed by etching the transparent electrode film; and in the fourth step, openings in a position corresponding to the connection part of the lower electrode layer of the protection film are defined by etching using the third photoresist as an etching mask, and the connection part is removed when removing the remaining portion of the lower electrode layer inside each opening of the protection film by performing an overetching treatment.

8. A method of producing a liquid crystal display device according to claim 3, wherein in the third step, a driving IC connection part for driving the liquid crystal display device continuously with the formation of the signal electrode when forming the upper electrode of the thin film diodes, the signal electrode and the picture-element electrode is formed by etching the transparent electrode film; and in the fourth step, the protection film is formed on the entire surface of the first substrate which was subject to the first and second steps, the third photoresist is subjected to a patterning treatment on the protection film, an etching treatment is performed using the third photoresist as an etching mask to define openings in corresponding positions between the picture-element electrodes of the protection film, between the signal electrode and the picture-element electrode, between the signal electrodes and in a position corresponding to the driving IC connection part, and an overetching treatment is performed to remove the remaining portion of the lower electrode layer inside each opening;

a resin film is formed so as to cover the opening in a position corresponding to the driving IC connection part of the protection film; and an etching treatment is performed using the third photoresist and the resin film as an etching mask to remove the remaining portion of the transparent electrode film inside each opening which is not covered with the resin film, and then the third photoresist and the resin film are removed.

9. A method of producing a liquid crystal display device according to claim 3, wherein in the third step, a driving IC connection part for driving the liquid crystal display device continuously with the formation of the signal electrode when forming the upper electrode of the thin film diodes, the signal electrode and the picture-element electrode is formed by etching the transparent electrode film; and in the fourth step, the protection film is formed on the entire surface of the first substrate which was subject to the first and second steps, the third photoresist is subjected to a patterning treatment on the protection film, an etching treatment is performed using the third photoresist as an etching mask to define openings in corresponding positions between the picture-element electrodes of the protection film, between the signal electrode and the picture-element electrode, between the signal electrodes and in a position corresponding to the driving IC connection part, and an overetching treatment is performed to remove the remaining portion of the lower electrode layer inside each opening;

a resin film is formed so as to cover the opening in a position corresponding to the driving IC connection part of the protection film; and an etching treatment is performed using the protection film and the resin film as an etching mask to remove the remaining portion of the transparent electrode film inside each opening which is not covered with the resin film.

10. A liquid crystal display device comprising a first transparent substrate and a second transparent substrate opposing each other with a certain gap, a liquid crystal filled between the first and second substrates, scanning electrodes, signal electrodes and picture-element electrodes forming each of a plurality of display picture-elements respectively disposed on the first substrate, thin film transistors provided between the scanning electrodes, the signal electrodes and each picture-element electrode as switching elements for controlling a flow of current to each picture-element electrode;

characterized in that a protection film is formed on an entire surface of the first substrate so as to cover the scanning electrodes, signal electrodes, each picture-element electrode and each thin film transistor, an opening portion is provided to have each opening in a position corresponding to at least between the scanning electrodes, and between the signal electrodes, and the remaining portion of the electrode layer material forming the scanning electrodes, signal electrodes and picture-element electrodes inside each opening is removed by etching.

11. The liquid crystal display device according to claim 10, wherein an opening portion is provided to have openings in corresponding positions between the scanning electrode and the picture-element electrode of the protection film, between the signal electrode and the picture-element electrode, between the scanning electrodes, between the signal electrodes, and between the scanning electrode and the signal electrode, and the remaining portion of the electrode layer material forming the scanning electrodes, signal electrodes or picture-element electrodes inside each opening is removed by etching.

12. A method of producing a liquid crystal display device comprising a first transparent substrate and a second transparent substrate opposing each other with a certain gap, a liquid crystal filled between the first and second substrates, scanning electrodes, signal electrodes and picture-element electrodes forming each of a plurality of display picture-elements respectively disposed on the first substrate, thin film transistors provided between the scanning electrodes, the signal electrodes and each picture-element electrode as switching elements for controlling a flow of current to each picture-element electrode, said method comprising, a first step for forming an electrode film made of respective electrode materials on the first substrate for the scanning electrodes, the signal electrodes, each picture-element electrode, a gate electrode, a source electrode, and a drain electrode forming each thin film transistor, comprising subjecting a photoresist to a patterning treatment on the electrode film, and repetitively performing an etching treatment using a patterned photoresist as an etching mask; and a second step for forming a protection film on the entire surface of the substrate on which each electrode and the thin film transistors are formed, comprising subjecting the photoresist to a patterning treatment on the protection film, etching the protection film using the patterned photoresist as an etching mask, defining each opening in positions corresponding to at least between the signal electrode and the picture-element electrode, between the scanning electrodes, and between the signal electrodes, and thereafter removing the remaining portion of the electrode film inside each opening.

13. The method of producing a liquid crystal display device according to claim 12, wherein the first step comprises forming a connection part which is continuous with the scanning electrodes and another connection part which is continuous with the signal electrodes respectively serving as a driving IC connection part for driving the liquid crystal display device;

the second step comprises forming the protection film on an entire surface of the substrate on which each electrode and the thin film transistors are formed, subjecting the photoresist to a patterning treatment on the protection film, etching the protection film using the patterned photoresist as an etching mask to define each opening in a position corresponding to at least between the signal electrode and the picture-element electrode, between the scanning electrodes, and between the signal electrodes, and in a position corresponding to the driving IC connection part;

a resin film is formed to cover the opening in a position corresponding to the driving IC connection part of the protection film, and an etching treatment is performed using the photoresist and the resin film as an etching mask, for removing the remaining portion of the electrode film in each opening which is not covered with the resin film, then the photoresist and the resin film are removed.

14. A method of producing a liquid crystal display device comprising a first transparent substrate and a second transparent substrate opposing each other with a certain gap, a liquid crystal filled between the first and second substrates, scanning electrodes, signal electrodes and picture-element electrodes forming each of a plurality of display picture-elements respectively disposed on the first substrate, thin film transistors provided between the scanning electrode, between the signal electrode and each picture-element electrode as switching elements for controlling a flow of current to each picture-element electrode, said method comprising:

a first step for forming a gate electrode material serving as the scanning electrodes on an entire surface of the first electrodes, comprising subjecting a first photoresist to a patterning treatment on the gate electrode material, etching the gate electrode material using the first photoresist as an etching mask, forming a first IC driving connection part for driving a gate electrode of thin film transistors, the scanning electrodes and the liquid crystal display device, and then removing the first photoresist;

a second step for forming a gate insulating film on an entire surface of the substrate which was subject to the first step, comprising subjecting a second photoresist to a patterning treatment on the gate insulating film, performing an etching treatment using the second photoresist as an etching mask to remove the gate insulating film on the first driving IC connection part, and then removing the second photoresist;

a third step for subsequently forming a semiconductor layer and a channel stopper layer on the gate insulating film, comprising subjecting a third photoresist to a patterning treatment on the channel stopper layer, performing an etching treatment using the third photoresist as an etching mask, subjecting the channel stopper layer to a patterning treatment on the semiconductor layer, and then removing the third photoresist;

a fourth step for subjecting a fourth photoresist to a patterning treatment on the semiconductor layer and the channel stopper layer, comprising etching the semiconductor layer using the fourth photoresist as an etching mask to form a semiconductor layer having a predetermined shape opposing the gate electrode, and then removing the fourth photoresist;

a fifth step for forming a film serving as a material making an ohmic contact layer on an entire surface of the substrate which was subject to the fourth step, comprising subjecting a fifth photoresist to a patterning treatment on the film, etching the film using the fifth photoresist as an etching mask to form the ohmic contact layer, and then removing the fifth photoresist;

a sixth step for forming a transparent electrode film on an entire surface of the substrate which was subject to the fifth step, comprising subjecting a sixth photoresist to a patterning treatment on the transparent electrode film, etching the transparent electrode film using the sixth photoresist as an etching mask to form the picture-element electrodes, and then removing the sixth photoresist, a seventh step for forming the source electrode and the drain electrode of the thin film transistors, and a film serving as a material of the signal electrodes on the entire surface of the substrate which was subject to the sixth step, comprising subjecting a seventh photoresist to a patterning treatment on the film, performing an etching treatment using the seventh photoresist as an etching mask to form the source electrode, the drain electrode, the signal electrodes and a second driving IC connection part, and then removing the seventh photoresist;

an eighth step for forming a protection film on the entire surface of the substrate which was subject to the seventh step, comprising subjecting an eighth photoresist to a patterning treatment on the protection film, etching the protection film using the eighth photoresist as an etching mask to define openings in a position corresponding to at least one portion between the scanning electrode and the picture-element electrode, between the signal electrode and the picture-element electrode, between the scanning electrodes, between the signal electrodes, between the scanning electrode and the signal electrode, and openings in a position corresponding to the first and second driving IC connection parts;

a ninth step forming a resin film to cover the openings defined in the positions corresponding to the first and second driving IC connection parts of the protection film; and a tenth step for removing the remaining portion of the electrode film inside each opening which is not covered with the resin film using the resin film, the eighth photoresist or the protection film as an etching mask.

* * * * *

UNITED STATES PATENT AND TRADEMARK OFFICE
CERTIFICATE OF CORRECTION

PATENT NO. : 5,963,279
DATED : October 5, 1999
INVENTOR(S) : Noboru Taguchi

It is certified that error appears in the above-identified patent and that said Letters Patent is hereby corrected as shown below:

Column 9, line 41, change "... the signal picture-element..." to be --the picture-element--.

Column 9, line 42, change "and between the scanning electrodes, between the" to be --between the scanning electrodes, and between the signal--.

Signed and Sealed this

Twenty-seventh Day of June, 2000

Attest:

Q. TODD DICKINSON

Attesting Officer

Director of Patents and Trademarks